United States Patent
Casiraghi et al.

(10) Patent No.: US 10,421,875 B2
(45) Date of Patent: Sep. 24, 2019

(54) EXFOLIATION

(71) Applicant: The University of Manchester, Manchester (GB)

(72) Inventors: Cinzia Casiraghi, Manchester (GB); Huafeng Yang, Honolulu, HI (US)

(73) Assignee: The University of Manchester, Manchester (GB)

( * ) Notice: Subject to any disclaimer, the term of this patent is extended or adjusted under 35 U.S.C. 154(b) by 0 days.

(21) Appl. No.: 15/114,571

(22) PCT Filed: Jan. 30, 2015

(86) PCT No.: PCT/GB2015/050228
§ 371 (c)(1),
(2) Date: Jul. 27, 2016

(87) PCT Pub. No.: WO2015/114357
PCT Pub. Date: Aug. 6, 2015

(65) Prior Publication Data
US 2016/0340533 A1    Nov. 24, 2016

(30) Foreign Application Priority Data
Jan. 31, 2014    (GB) .................................. 1401715.6

(51) Int. Cl.
*B05D 7/24*      (2006.01)
*C01G 1/12*      (2006.01)
(Continued)

(52) U.S. Cl.
CPC .............. *C09D 11/52* (2013.01); *B01D 71/02* (2013.01); *B05D 7/24* (2013.01); *C01B 17/20* (2013.01);
(Continued)

(58) Field of Classification Search
CPC ...... H01B 3/002; C01B 21/0687; B82Y 10/00
(Continued)

(56) References Cited

U.S. PATENT DOCUMENTS

| | | | |
|---|---|---|---|
| 2011/0045223 A1* | 2/2011 | Lin | ...................... C01B 21/0687 428/36.9 |
| 2012/0052301 A1* | 3/2012 | Linder | ................... B82Y 10/00 428/408 |

(Continued)

FOREIGN PATENT DOCUMENTS

| | | |
|---|---|---|
| GB | 2483288 A | 3/2012 |
| WO | WO-2012/028724 A1 | 3/2012 |

(Continued)

OTHER PUBLICATIONS

Zhang et al., "Production of Graphene Sheets by Direct Dispersion with Aromatic Healing agent", Small 2010, pp. 1-8.*
(Continued)

*Primary Examiner* — Khanh T Nguyen
(74) *Attorney, Agent, or Firm* — Wilmer Cutler Pickering Hale and Dorr LLP

(57) ABSTRACT

This invention relates to a method for exfoliating inorganic layered compounds to form two-dimensional (2D) inorganic compounds. The exfoliation is carried out in aqueous media in the present of polycyclic aromatic compounds. The invention also relates to aqueous suspensions of two-dimensional compounds which arise from the exfoliation method. The invention further relates to methods of forming thin films of two-dimensional compounds from suspensions and to devices comprising thin films of two-dimensional (2D) inorganic compounds.

19 Claims, 15 Drawing Sheets

(51) Int. Cl.
| | |
|---|---|
| C09D 11/52 | (2014.01) |
| C01B 21/064 | (2006.01) |
| C01G 39/06 | (2006.01) |
| C01G 41/00 | (2006.01) |
| C01B 17/20 | (2006.01) |
| C01B 19/00 | (2006.01) |
| H01L 31/0264 | (2006.01) |
| H01L 31/0445 | (2014.01) |
| C09D 11/32 | (2014.01) |
| C09D 11/38 | (2014.01) |
| H01L 29/786 | (2006.01) |
| H01L 31/0304 | (2006.01) |
| H01L 31/032 | (2006.01) |
| H01L 31/113 | (2006.01) |
| B01D 71/02 | (2006.01) |
| H01L 31/0352 | (2006.01) |
| B82Y 30/00 | (2011.01) |
| B82Y 40/00 | (2011.01) |

(52) U.S. Cl.
CPC ........ *C01B 19/007* (2013.01); *C01B 21/0648* (2013.01); *C01G 1/12* (2013.01); *C01G 39/06* (2013.01); *C01G 41/00* (2013.01); *C09D 11/32* (2013.01); *C09D 11/38* (2013.01); *H01L 29/78681* (2013.01); *H01L 29/78696* (2013.01); *H01L 31/0264* (2013.01); *H01L 31/0324* (2013.01); *H01L 31/03044* (2013.01); *H01L 31/035209* (2013.01); *H01L 31/0445* (2014.12); *H01L 31/113* (2013.01); *H01L 31/1136* (2013.01); *B82Y 30/00* (2013.01); *B82Y 40/00* (2013.01); *C01P 2002/82* (2013.01); *C01P 2002/84* (2013.01); *C01P 2002/85* (2013.01); *C01P 2004/02* (2013.01); *C01P 2004/04* (2013.01); *C01P 2004/24* (2013.01); *Y10S 977/755* (2013.01); *Y10S 977/90* (2013.01); *Y10S 977/948* (2013.01)

(58) Field of Classification Search
USPC .................................. 252/572; 428/36.9, 408
See application file for complete search history.

(56) References Cited

U.S. PATENT DOCUMENTS

| | | |
|---|---|---|
| 2012/0288762 A1 | 11/2012 | Hardin et al. |
| 2014/0077138 A1* | 3/2014 | Taha-Tijerina ........ H01B 3/002 252/572 |

FOREIGN PATENT DOCUMENTS

| | | |
|---|---|---|
| WO | WO-2012/127245 A2 | 9/2012 |
| WO | WO-2013/140181 A1 | 9/2013 |

OTHER PUBLICATIONS

International Search Report and Written Opinion dated Aug. 4, 2015, in the International Application No. PCT/GB2015/050228, filed on Jan. 30, 2015, 12 pages.

Lee et al., "Enhanced Mechanical Properties of Epoxy Nanocomposites by Mixing Noncovalently Functionalized Boron Nitride Nanoflakes," Small, vol. 9, No. 15, p. 2602-2610, Aug. 2013.

Novoselov et al., "Electric Field Effect in Atomically Thin Carbon Films," Science, vol. 306, No. 5696, pp. 666-669, Oct. 22, 2004.

Schlierf et al,; "Nanoscale insight into the exfoliation mechanism of graphene with organic dyes: effect of charge, dipole and molecular structure," Nanoscale, vol. 5, pp. 4205-4216, (2013).

Smith et al., "Large-Scale Exfoliation of Inorganic Layered Compounds in Aqueous Surfactant Solutions," Advanced Materials, vol. 23, pp. 3944-3948, (2011).

United Kingdom Search Report dated Sep. 25, 2014, in application No. GB1401715.6, 4 pages.

Yang et al., "A simple method for graphene production based on exfoliation of graphite in water using 1-pyrenesulfonic acid sodium salt," Carbon, vol. 53, (2013), pp. 357-365.

Yang et al., "Dielectric nanosheets made by liquid-phase exfoliation in water and their use in graphene-based electronics," 2D Materials, 1 (2014) 011012, 11 pages.

Zhang et al., "Pyrene-conjugated hyaluronan faciltated exfoliation and stabilisation of low dimensional nanomaterials in water," Chemical Communications, vol. 49, 11 pages (2013).

Golberg et al., "Boron Nitride Nanotubes and Nanosheets", ACS NANO, Jun. 22, 2010, vol. 4, No. 6, pp. 2979-2993.

Johal, S. "Chemical Exfoliation of graphene and other 2D-materials," A thesis submitted to The University of Manchester, published Aug. 23, 2013, 71 pages.

Xue et al., "Excellent electrical conductivify of the exfoliated and fluorinated hexagonal boron nitride nanosheets," Nanoscale Research Letters, vol. 8, No. 49, 7 pages.

Shi et al., "Fabrication of pyrenetetrasulfonate/layered double hydroxide ultrathin films and their application in fluorescence chemosensors," Journal of Materials Chemistry, published online Mar. 18, 2011, vol. 21, pp. 6088-6094.

Yan et al., "Enhanced thermal-mechanical properties of polymer composites with hybrid boron nitride nanofillers," Applied Physics A, published online Nov. 20, 2013, vol. 114, pp. 331-337.

* cited by examiner

EXFOLIATION

REFERENCE TO RELATED APPLICATIONS

This Application is a national Stage Entry of PCT International Application No. PCT/GB2015/050228 filed Jan. 30, 3015, which claims priority to GB 1401715.6, filed Jan. 31, 2014, the contents of which are incorporated herein by reference in their entirety.

This invention relates to a method for exfoliating inorganic layered compounds to form two-dimensional (2D) inorganic compounds. These two-dimensional compounds have the same dimensionality as graphene in that they can be obtained as single- or few-layered molecular crystals. It also relates to suspensions of two-dimensional compounds which arise from the exfoliation method. The invention further relates to methods of forming thin films of two-dimensional compounds from suspensions and to devices comprising thin films of two-dimensional (2D) inorganic compounds.

BACKGROUND

The advent of graphene (K. S. Novoselov, A. K. Geim, S. V. Morozov, D. Jiang, Y. Zhang, S. V. Dubonos, I. V. Grigorieva and A. A. Firsov, "Electric field Effect in Atomically Thin Carbon Films" Science, Vol. 306, No. 5696, pp. 666-669, 2004.) and subsequent discovery of its multitude of superior properties, has led to the identification of many other two-dimensional crystals through exfoliation of suitable layered compounds. These materials are all molecular and are typically compounds formed from 2, 3, 4 or 5 different elements. Compounds which have been isolated as single- or few layer platelets or crystals include hexagonal boron nitride, $NbSe_2$, bismuth strontium calcium copper oxide (BSCCO) and $MoS_2$. These single or few layer platelets or crystals are stable and can exhibit complementary electronic properties to graphene, such as being insulators, semiconductors and superconductors.

The large variety of 2D crystals isolated in the recent years offers a rich platform for the creation of heterostructures which combine several of these compounds in one stack. Since, collectively, this class of compounds covers a very broad range of properties, the obtained heterostructures can be tuned to focus on particular phenomena, or be used for specific applications (or even to perform multiple functions).

Thus, inorganic single or few layer compounds can be used either alone or in combination with other such materials and/or with graphene to form ultrathin electronic devices with astonishing properties. BN and $MoS_2$ have been used in conjunction with graphene to form quantum tunnelling transistor heterostructures (WO2012/127245) while $MoS_2$ and $WS_2$ have been used in conjunction with graphene to form photovoltaic heterostructures (WO2013/140181).

Still, up to now heterostructures have predominantly been produced by micromechanical cleavage of three-dimensional layered crystals with subsequent dry transfer of each crystal layer. While this technique allows one to achieve extremely high quality heterostructures. This technique is labour intensive and time consuming and it cannot be applied to the production of such heterostructures on a large scale. Ultimately, this method is likely to be unsuitable for mass-production, and is unlikely to be able to satisfy demand for these materials for use in real-life applications.

Thin films of inorganic compounds can be formed from the deposition of dispersions of flakes of such compounds. Liquid-phase exfoliation has been employed as a scalable approach for production of two-dimensional crystals in dispersed form. This method is based on exfoliation of their bulk counterparts via chemical wet dispersion followed by ultra-sonication. Whilst this technique offers many advantages for cost reduction, scalability and compatibility with any substrate, including cheap and flexible substrates, existing methods suffer the disadvantage of requiring media which are not environmentally friendly. Currently this is mostly based on the use of organic solvents such as N-Methylpyrrolidone (NMP) and N,N-dimethylformamide (DMF), which are chosen because of their compatibility with the resulting dispersed phase. These solvents are invariably toxic, expensive and characterized by high boiling points. While these solvents can produce a high yield of single-layer graphene in suspension, they are also less efficient in exfoliating graphene analogues.

WO2012/028724 describes a method of exfoliating $MoS_2$ with water/surfactant (e.g. sodium cholate) mixtures to provide suspensions which are suitable for forming thin films made up of individual flakes of $MoS_2$. The concentrations of the inorganic compounds in the resultant suspensions are low (see also Smith et al, Adv. Mat. 2011, 23, 3944). This may be because these solvent/surfactant systems have only low effectiveness in supporting the dispersed phase.

Zhang et al (Chem. Comm., 2013, 49, 4845-4847) have shown that a hyaluronan backbone substituted with pyrenes can be used to generate a dispersion of hyaluronan supported two dimensional materials, such as BN and $MoS_2$, suitable for use in delivering the two dimensional materials to biological systems. It is believed that the hyaluronan backbone has a role both in achieving exfoliation and in increasing the stability of the resultant suspensions. Less than 20% of the available carboxylic acids in the hyaluronan support are functionalised with pyrenes. The loading of the two-dimensional material onto the hyaluronan backbone is small. It seems unlikely that the dispersions generated from this method would be suitable for the formation of thin films with certain properties which because the large amounts of the polysaccharide hyaluronan substrate would be present in the resultant deposited thin films. It seems likely that this would be detrimental to the integrity of the deposited thin films.

Pyrene sulfonic acids have been shown to be effective at exfoliating graphene to form dispersions in aqueous media (Yang et al; Carbon, 53, 2013, 357-365; Schlierf et al; Nanoscale, 2013, 5, 4205-4216). The efficiency of the process depends on a range of factors: the thermodynamics of exfoliation; the presence of local energy minima influencing the kinetics of the process; and solvent-molecule, solvent-graphene and graphene-molecule competitive interactions. It is understood that the unique electron distribution in graphene contributes to the success of this exfoliation process. Pyrene molecules associate with graphene through π-π interactions. Such π-π interactions would be expected to be considerably weaker in strength between polyaromatic compounds such as pyrene and inorganic layered compounds. These compounds do not enjoy the same uniform electron distribution that is present in graphene. Furthermore, the bonding between layers of inorganic layered compounds is very different to that between graphene layers. For example, in the case of h—BN, the bonding between neighbouring BN layers is formed by so called 'lip-lip' interactions, which would be expected to be stronger than the weak Van der Waals forces operating between graphene layers.

It is an aim of certain embodiments of the invention to provide a method for exfoliating layered inorganic compounds to form aqueous dispersions of single and few-layered inorganic compounds in high yields. In is an aim of certain embodiments to provide methods of forming said dispersions in higher yields than those made by prior art methods.

It is an aim of certain embodiments of the invention to provide a method for exfoliating layered inorganic compounds to form aqueous dispersions of single and few-layered inorganic materials in high concentrations. In is an aim of certain embodiments to provide methods of forming said dispersions in higher concentrations than those made by prior art methods.

It is an aim of certain embodiments of the invention to provide a method for exfoliating layered inorganic compounds to form stable aqueous dispersions of single and few-layered inorganic materials. It is an aim of certain embodiments of the invention to provide a method for exfoliating layered inorganic compounds to form aqueous dispersions of single and few-layered inorganic materials which are more stable than those made by prior art methods.

Thus far, no method has been developed for the preparation of aqueous dispersions of single and few-layered layered inorganic compounds at a sufficiently high concentration for an effective thin film to be printed in a single coat or in only a few coats. It has also not been shown that thin films can be formed of a high enough quality from dispersions in such media to exhibit properties similar to those of the heterostructure based devices formed from single crystals of inorganic single- or few-layer compounds. It is thus an aim of certain embodiments of this invention to provide a method for exfoliating layered inorganic compounds to form an aqueous dispersion suitable for forming thin films. Another aim of certain embodiments of the invention is to provide high quality dispersions which can be deposited in the form of thin films without leaving undesirable residues and/or which do not require significant further treatments to ensure the integrity of the deposited film.

BRIEF SUMMARY OF THE DISCLOSURE

In a first aspect of the present invention there is provided a method of producing an aqueous suspension of particles of a two-dimensional inorganic compound, the method comprising:
  a) providing multilayered particles of the inorganic compound in an aqueous medium which comprises at least one polycyclic aromatic compound, or a salt thereof; wherein the or each polycyclic aromatic compound independently has a ring system which comprises from 2 to 10 fused benzene rings, the ring system being substituted with from 1 to 4 independently selected hydrophilic groups, each hydrophilic group consisting of less than 20 atoms
  b) subjecting the multilayered particles of the inorganic compound in the aqueous medium to energy to obtain an aqueous suspension comprising the particles of the two-dimensional inorganic compound;
  c) where the suspension obtained in step b) also comprises multilayered particles of the inorganic compound, the method optionally further comprises the step of reducing the amount of multilayered particles of the inorganic compound in the suspension.

In other words, the invention may provide a method of producing an aqueous suspension of single- or few-layered particles of an inorganic layered compound, the method comprising:
  a) providing multilayered particles of the inorganic layered compound in an aqueous medium which comprises at least one polycyclic aromatic compound, or a salt thereof; wherein the or each polycyclic aromatic compound independently has a ring system which comprises from 2 to 10 fused benzene rings, the ring system being substituted with from 1 to 4 independently selected hydrophilic groups, each hydrophilic group consisting of less than 20 atoms
  b) subjecting the multilayered particles of the inorganic layered compound in the aqueous medium to energy to obtain an aqueous suspension comprising single- or few-layered particles of the inorganic layered compound;
  c) where the suspension obtained in step b) also comprises multilayered particles of the inorganic layered compound, the method optionally further comprises the step of reducing the amount of multilayered particles of the inorganic layered compound in the suspension.

The polycyclic aromatic compounds of the present invention have been found to be particularly efficient dispersants (i.e. they help form and maintain the dispersion of the particles in the aqueous vehicle). The preferred way to prepare the formulations of the present invention is to form the particles in situ within the aqueous vehicle defined herein by exfoliating larger particles of the bulk multi-layered inorganic material. The polyaromatic compounds of the present invention are particularly efficient at effecting the exfoliation of bulk inorganic layered materials to form the required particles. The use of these compounds also has a beneficial effect on the loading of particles that can be achieved in the resultant dispersion.

It is surprising that such small molecules are capable of achieving efficient exfoliation and of achieving stabilisation of the dispersions and thus of producing good yields of two-dimensional materials. It is believed that bulky substituents have the effect of forcing the individual layers of a multi-layered material apart once they have intercalated and of keeping the dispersed flakes apart once they are in suspension. It is surprising that compounds with substituents having a limited size, such as substituents having less than 20 atoms, also provide good yields.

Furthermore, it is also believed that, if the hydrophilic group is too large (e.g. over 20 atoms in size), as a thin film of flakes of two-dimensional compounds is formed the quality of the resultant thin film may be compromised, leading to films without the required properties. In contrast, the aqueous suspension comprising single- or few-layered particles of the inorganic layered compound made by the methods of present invention will typically be suitable for forming a thin film comprising a plurality of particles of the inorganic layered compound.

The terms 'two-dimensional' and 'single or few layered' are used interchangeably throughout this specification. The two-dimensional or single or few layered particles formed in the processes of the first aspect of the invention may also be described as nanosheets.

The energy applied to convert the multi-layered particles into a dispersion of nanoparticles in step (b) may be sonic energy. The sonic energy may be ultrasonic energy. It may be delivered in using a bath sonicator or a tip sonicator. Alternatively the energy may be a mechanical energy, e.g. shear force energy or grinding. The particles may be subjected to energy (e.g. sonic energy) for a length of time from 15 min to 1 week, depending on the properties and proportions (flake diameter and thickness) desired. The particles may be subjected to energy (e.g. sonic energy) for a length of time from 1 to 4 days.

The step of reducing the amount of multilayered particles in the suspension may comprise using a centrifuge. Advantageously, the solvent present in the final suspension is that which was present for the exfoliation process. In other words, the single- or few-layered particles are not removed from the exfoliation solvent during the purification process. The suspension prepared by this process is suitable for depositing a thin film. The process can thus be considered a 'one-pot' process, and is efficient in terms of time, energy and materials (e.g. solvents). For the absence of doubt, it is within the scope of this invention that a portion of the solvent which was present for the exfoliation is removed with the multi-layered particles.

The method may comprise adding additives to the suspension of two-dimensional inorganic material. These additives will be selected based on the desired use of the suspension. The additives may enable the suspension to be used as an ink, e.g. in an inkjet printer. The additives may make the suspension more stable. The additives may change the physical or chemical properties of the suspension e.g. the viscosity, pH etc.

In a second aspect of the invention, there is provided a suspension of particles of a two-dimensional inorganic compound in an aqueous medium comprising at least one polycyclic aromatic compound; wherein the or each polycyclic aromatic compound independently has a ring system which comprises from 2 to 6 fused benzene rings, the ring system being substituted with from 1 to 4 hydrophilic groups each independently consisting of less than 20 atoms.

In other words, there is provided a suspension of single- or few-layered particles of an inorganic layered compound in an aqueous medium comprising at least one polycyclic aromatic compound; wherein the or each polycyclic aromatic compound independently has a ring system which comprises from 2 to 6 fused benzene rings, the ring system being substituted with from 1 to 4 hydrophilic groups each independently consisting of less than 20 atoms.

The suspension of the second aspect may be made by the method of the first aspect.

In a third aspect of the invention, there is provided an electronic device comprising a two-dimensional heterostructure, the two-dimensional heterostructure including at least one thin film layer which comprises a plurality of particles of a two-dimensional inorganic compound. In other words, there is provided an electronic device comprising a two-dimensional heterostructure, the two-dimensional heterostructure including at least one thin film layer which comprises a plurality of single- or few-layered particles of an inorganic layered compound.

It may be that the device further comprises a layer of graphene.

The electronic device may be or comprise a photovoltaic cell in which the light harvesting portion is a two-dimensional heterostructure comprising at least the following layers:
  a first electrode layer which comprises graphene or modified graphene (e.g. doped graphene);
  at least one thin film comprising a plurality of particles of a two-dimensional transition metal dichalcogenide; and
  a second electrode layer;
wherein the layers are stacked to form a laminate structure in which the or each thin film layer of transition metal dichalcogenide is situated between the first and the second electrode layer and the or each thin film layer of transition metal dichalcogenide is in electrical contact with both electrodes.

The second electrode layer may also comprise graphene. The transition metal dichalcogenide may be $WS_2$.

The device may be or comprise a photodetector, the photodetector comprising:
  a gate electrode;
  a layer of graphene connected to a source electrode and a drain electrode; and
  the at least one thin film layer comprising a plurality of particles of a two-dimensional inorganic compound in contact with and situated between both the graphene layer and electrode and the gate electrode.

The inorganic two-dimensional compound may be h-BN.
The electronic device may be a transistor comprising:
  a source electrode;
  a drain electrode; and
  the at least one thin film layer comprising a plurality of particles of a two-dimensional inorganic compound in contact with and situated between both the source electrode and the drain electrode
wherein at least one of the source electrode and drain electrode comprises graphene and the other electrode comprises a layer of a conductive material. It may be that both the source electrode and the drain electrode comprise graphene.

The or each thin film may comprise a plurality of particles of two-dimensional h-BN. Alternatively, the or each thin film may comprise a plurality of particles of two-dimensional transition metal dichalcogenide (e.g. $MoS_2$).

Where the device comprises a layer of graphene, that graphene layer may independently comprise a thin film of graphene flakes. Alternatively, that graphene layer may comprise a single crystal of graphene. Thus, the graphene may have been produced by mechanical exfoliation or by chemical vapour deposition.

The thin film may in fact comprise a plurality of thin films arising respectively from a plurality of individual deposition steps.

It may be that the or each thin film (e.g. of a two-dimensional inorganic compound or of graphene) contains at least one polycyclic aromatic compound; wherein the or each polycyclic aromatic compound independently has a ring system which comprises from 2 to 6 fused benzene rings, the ring system being substituted with from 1 to 4 hydrophilic groups each independently consisting of less than 20 atoms. The polycyclic aromatic compound may not be a significant component of the thin film but it will still be present in a detectable amount (e.g. less than 15% by weight or less than 5% by weight or less than 1% by weight).

In a fourth aspect of the invention is provided an electronic device, the device comprising at least one thin film layer which comprises a plurality of particles of a two-dimensional inorganic compound, wherein the or each thin film contains at least one polycyclic aromatic compound; wherein the or each polycyclic aromatic compound independently has a ring system which comprises from 2 to 6 fused benzene rings, the ring system being substituted with from 1 to 4 hydrophilic groups each independently consisting of less than 20 atoms.

The device may be a transistor. The device may be a photodetector or photovoltaic cell.

The polycyclic aromatic compound may not be a significant component of the thin film but it will still be present in a detectable amount (e.g. less than 15% by weight or less than 5% by weight or less than 1% by weight).

It may be that the device further comprises at least one layer of graphene. The or each layer of graphene may be in the same plane as the or each thin film of two-dimensional particles of inorganic compound. Alternatively, the thin film of two-dimensional particles of inorganic compound and the or each layer of graphene form part of a stack or heterostructure.

The or each thin film may comprise a plurality of particles of two-dimensional h-BN. Alternatively, the or each thin film may comprise a plurality of particles of two-dimensional transition metal dichalcogenide (e.g. $MoS_2$).

Where the device comprises a layer of graphene, that graphene layer may independently comprise a thin film of graphene flakes. Alternatively, that graphene layer may comprise a single crystal of graphene. Thus, the graphene may have been produced by mechanical exfoliation or by chemical vapour deposition.

Where the device comprises a thin film of graphene flakes, the thin film may also contain at least one polycyclic aromatic compound; wherein the or each polycyclic aromatic compound independently has a ring system which comprises from 2 to 6 fused benzene rings, the ring system being substituted with from 1 to 4 hydrophilic groups each independently consisting of less than 20 atoms.

Where a thin film (e.g. a two-dimensional inorganic material thin film or a graphene thin film) comprises a polycyclic aromatic compound may not be a significant component of the thin film but it will still be present in a detectable amount (e.g. less than 15% by weight or less than 5% by weight or less than 1% by weight).

The or each thin film may in fact comprise a plurality of thin films arising respectively from a plurality of individual deposition steps.

The or each thin film featured in the fourth aspect may be made by the method of the fifth aspect. Likewise, the two-dimensional heterostructure featured in the third aspect may be made by the method of the fifth aspect. Likewise, the electronic device of the third of fourth aspect may be made by the method of the fifth aspect.

In a fifth aspect of the invention, there is provided method of forming a thin film comprising a plurality of particles of an inorganic two dimensional compound, the method comprising:
  a) obtaining an aqueous suspension of particles of a two-dimensional inorganic compound by the method of the first aspect; and
  b) depositing the suspension of single- or few-layered particles of the two-dimensional inorganic compound in an aqueous medium onto a substrate to form the thin film comprising a plurality of particles of the inorganic two dimensional compound.

In other words, there is provided method of forming a thin film comprising a plurality of single- or few-layered layered particles of an inorganic layered compound, the method comprising
  a) obtaining an aqueous suspension of single- or few-layered particles of an inorganic layered compound by the method of the first aspect; and
  b) depositing the suspension of single- or few-layered particles of the inorganic layered compound in an aqueous medium onto a substrate to form a thin film comprising a plurality of single- or few-layered layered particles of the inorganic layered compound.

The method may be a method of making an electronic device, in which case the thin film is comprised in the electronic device.

In an embodiment, the method is a method of making a two-dimensional heterostructure and the thin film is comprised in the two dimensional heterostructure. Thus, the method may be a method of making a two-dimensional heterostructure, the method comprising
  a) obtaining an aqueous suspension of particles of a two-dimensional inorganic compound by the method of the first aspect; and
  b) depositing the suspension of single- or few-layered particles of the two-dimensional inorganic compound in an aqueous medium onto a substrate to form a thin film comprising a plurality of particles of the inorganic two dimensional compound;
wherein the thin film is comprised in the resultant two-dimensional heterostructure.

In other words, there is provided method of forming a two-dimensional heterostructure, the method comprising
  a) obtaining an aqueous suspension of single- or few-layered particles of an inorganic layered compound by the method of the first aspect; and
  b) depositing the suspension of single- or few-layered particles of the inorganic layered compound in an aqueous medium onto a substrate to form a thin film comprising a plurality of single- or few-layered layered particles of the inorganic layered compound.

The method may be a method of making an electronic device, in which case the two-dimensional heterostructure is comprised in the electronic device.

The step of depositing the suspension onto the substrate may comprise a drop casting process.

Alternatively, the step of depositing the suspension onto the substrate may comprise a filtering and fishing technique. Thus, the step of depositing the suspension onto the substrate may comprise the following steps:
  a) subjecting the suspension to vacuum filtration through a filter membrane with nanometer sized pores to form a thin film comprising a plurality of particles of a two-dimensional inorganic compound deposited on the membrane;
  b) placing the membrane in water, allowing the thin film to separate from the membrane, to provide the thin film suspended in water;
  c) removing the thin film from the water and placing onto the desired substrate.

The filtering and fishing technique tends to provide a thinner film than other existing methods, for example it can give transition metal dicalcogenide films of around 20 nm. Such films can if desired be deposited on top of each other by repeating the filtering and fishing steps several times. Filtering and fishing techniques are preferred where the two dimensional material is a transition metal dichalcogenide.

The step of depositing the suspension may be repeated one or more times. In particular, where the filtering and fishing technique is used for transition metal dichalcogenides, a number of iterations may be required to obtain a film of the required thickness.

The method may comprise one or more subsequent processing steps to improve the properties of the resultant thin film.

Thus, the process may comprise one or more annealing steps.

Likewise, the method may comprise the step of washing the thin film (e.g. with water or an aqueous solution) to reduce the amount of the polycyclic aromatic compound present in the device. This step may remove all of the polycyclic aromatic compound but more typically small amounts of the polycyclic aromatic compound will remain in the thin film.

The following statements apply, where not mutually exclusive, to any one of the above described aspects of the invention.

The presence of hydrophilic groups allows the polycyclic aromatic compound to interact with the water as well as the particle of the inorganic layered material (which interacts with the polycyclic aromatic core). The polycyclic aromatic compound acts as a dispersant, thereby stabilising the resultant dispersion of the particles formed in the aqueous media. Without wishing to be bound by any particular theory, it is believed that as the particles are formed, for example by sonic energy to exfoliate the bulk material, the polycyclic aromatic compounds penetrate between the layers of the inorganic material and non-covalently interact with the surfaces of the layers. It is believed that the polyaromatic compound therefore aids the delamination of the bulk material and then prevents the nanoparticles from re-aggregating.

If the hydrophilic group is too large, (e.g. over 20 atoms in size) it could reduce or prevent the penetration and interaction with the layers of the inorganic material.

The polycyclic aromatic compound may have a ring system which comprises from 2 to 10 fused benzene rings, the ring system being substituted with from 1 to 4 independently selected hydrophillic groups, each hydrophilic group consisting of less than 20 atoms. In an embodiment, the ring system may have from 2 to 8 or, more typically, 3 to 6 fused benzene rings. In a particular embodiment, the ring system has four fused benzene rings. Where the ring system contains three or more benzene rings (e.g. four benzene rings), it may be that the rings are not arranged linearly. Thus, the ring system may have at least one ring which is ortho- and peri-fused to two further rings respectively. In other words, it may be that at least one ring contains two atoms in common with each of two or more other rings.

The independently selected hydrophilic groups may consist of less than 10 atoms or they may consist of less than 6 atoms. The atoms in question may be independently selected from S, O, P, H, C, N, B and I. Exemplary hydrophilic groups include $SO_3H$, $SO_2H$, $B(OH)_2$, $CO_2H$, OH and $PO_3H$. Suitably, when the polycyclic aromatic compound comprises three or four hydrophilic groups, they are not all the same. Typically, when the polycyclic aromatic compound comprises three or four hydrophilic groups the hydrophilic groups will not all be situated on the same benzene ring.

The polycyclic aromatic compound may be a salt and may therefore be a base addition salt. The abovementioned hydrophilic groups may therefore be $SO_3M$, $SO_2M$, $CO_2M$ and $PO_3M$, where M is a cation, e.g. a cation selected from $Na^+$, $K^+$, $Li^+$ and $NH_4^+$.

It may be that at least one hydrophilic group is a sulfonic acid or a base addition salt of a sulfonic acid.

Some of these exemplary pyrene sulfonic acid salts are dyes used, for example, in highlighter pens. They are thus commercially available.

In a particular example, the polycyclic aromatic compound may be a pyrene substituted with from 1 to 4 hydrophilic groups. It may be that the hydrophilic groups are selected from $SO^3M$ and OH. Specific examples include:

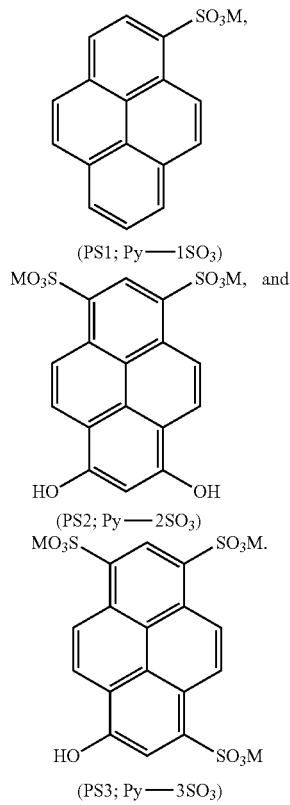

(PS1; Py—1SO$_3$)

(PS2; Py—2SO$_3$)

(PS3; Py—3SO$_3$)

The polycyclic aromatic compound may be present in the aqueous media in an amount from $1 \times 10^{-4}$ mol/L to $200 \times 10^{-4}$ mol/L. More suitably, it may be present in an amount from $1.15 \times 10^{-4}$ mol/L to $66 \times 10^{-4}$ mol/L, and even more suitably, $1.15 \times 10^{-4}$ mol/L to $33 \times 10^{-4}$ mol/.

The term 'aqueous medium' can be understood to mean a liquid which contains water, e.g. which contains greater than 20% by volume water. The aqueous medium may contain more than 50% by volume water, e.g. more than 75% by volume water or more than 95% by volume water. The aqueous medium may also comprise solutes or suspended particles. Many polycyclic aromatic compounds are only sparingly soluble in water. The 'aqueous medium' may also comprise other solvents. It may therefore comprise organic solvents which may or may not be miscible with water. Where the aqueous medium comprises organic solvents, those solvents may be immiscible or sparingly miscible and the aqueous medium may be an emulsion. The aqueous medium may comprise solvents which are miscible with water, for example alcohols (e.g. methanol and ethanol). The aqueous medium may comprise additives which may be ionic, organic or amphiphillic. Examples of such additives include surfactants, viscosity modifiers, pH modifiers, iconicity modifiers, dispersants.

Thus, the aqueous media may also comprise an alcohol (e.g. methanol) or a diol (e.g. ethylene glycol). The alcohol or diol may form from 1% to 50% by volume of the aqueous media. The alcohol or dio may form from 10% to 30% by volume of the aqueous media, e.g. about 20% by volume of the aqueous media.

The aqueous media may comprise deuterated solvents, e.g. deuterated water and deuterated methanol. Such solvents may be deuterated to the extent required to make them suitable for use in NMR. Thus, the water which forms the aqueous media may be greater than 99% deuterated, e.g. greater than 99.9% or 99.99% deuterated. The use of deuterated solvents would allow the suspended material to be characterised by NMR.

The aqueous medium may have any pH. The aqueous medium may have a pH in the range from 1 to 13. The aqueous medium may have a pH in the range from 1 to 7, e.g in the range from 1 to 3. The aqueous medium may have a pH of about 2. Particularly (but not exclusively) where the polycyclic aromatic compound is Py-2SO$_3$, high concentrations of exfoliated inorganic layered compounds can be obtained at acidic pHs (e.g. from 1 to 7 or from 1 to 3 or about 2). Acidic pHs are particularly preferred where the two dimensional inorganic compound is h-BN.

The aqueous medium may have a pH in the range 5 to 9, e.g. from 6 to 8. Neutral pHs are particularly preferred where the two dimensional inorganic compound is a transition metal dichalcogenide.

It may be that greater than 50% by weight (e.g. greater than 75% by weight, greater than 90% or greater than 98%) of the two-dimensional inorganic compound have a diameter between 50 and 750 nm. It may be that greater than 50% by weight (e.g. greater than 75% by weight, greater than 90% or greater than 98%) of the particles have a diameter of less than 500 nm. Thus, it may be that greater than 50% by weight (e.g. greater than 75% by weight, greater than 90% or greater than 98%) of the particles have a diameter between 100 and 500 nm.

It may be that greater than 50% by weight (e.g. greater than 75% by weight, greater than 90% or greater than 98%) of the two-dimensional inorganic compound have a thickness of from 1 to 10 molecular layers.

It may be that greater than 50% by weight (e.g. greater than 75% by weight, greater than 90% or greater than 98%) of the two-dimensional inorganic compound has a thickness of from 1 to 5 molecular layers. Thus, it may be that greater than 50% by weight (e.g. greater than 75% by weight, greater than 90% or greater than 98%) of the two-dimensional inorganic compound has a thickness of from 1 to 3 molecular layers. These statements apply particularly to particles of h-BN.

It may be that greater than 50% by weight (e.g. greater than 75% by weight, greater than 90% or greater than 98%) of the two-dimensional inorganic compound has a thickness of from 3 to 8 molecular layers. Thus, it may be that greater than 50% by weight (e.g. greater than 75% by weight, greater than 90% or greater than 98%) of the two-dimensional inorganic compound has a thickness of from 4 to 6 molecular layers. These statements apply particularly to particles of transition metal dichalcogenides.

The concentration of particles in the aqueous suspension may be within the range of 0.01 to 5 mg/ml. More typically, the concentration of particles is within the range of 0.01 to 1 mg/ml. Even more typically, the concentration of particles is within the range of 0.01 to 0.5 mg/ml.

Suitably, the concentration of particles in the aqueous suspension is greater 0.01 mg/ml, and preferably greater than 0.5 mg/ml.

Certain of the suspensions made according to the method of the first aspect (e.g. the suspensions according to the second aspect), and particularly the BN-containing suspensions, and/or the resultant thin films formed by these suspensions, possess high thermal conductivities, which means that they could be used in thermal management applications. These suspensions, and/or the thin films derived therefrom, may possess thermal conductivities within the range 30-100 W/mK, e.g. within the range 50-80 W/mK.

The inorganic compound may be h-BN. Single layer h-BN is structurally similar to graphene, but unlike its carbon analogue, it is an insulator with a large band gap (~6 eV). This, added to unique features such as excellent chemical, mechanical properties, and thermal stability, allows using h-BN nanosheets (BNNS) in a variety of applications, such as component in nanodevices, solid lubricant, UV-light emitter and as insulating thermo-conductive filler in composites.

The inorganic compound may be a transition metal dichalcogen (e.g. MoS$_2$, WS$_2$, MoTe$_2$, MoSe$_2$ etc.).

BRIEF DESCRIPTION OF THE DRAWINGS

Embodiments of the invention are further described hereinafter with reference to the accompanying drawings, in which.

DETAILED DESCRIPTION

Figure 1:
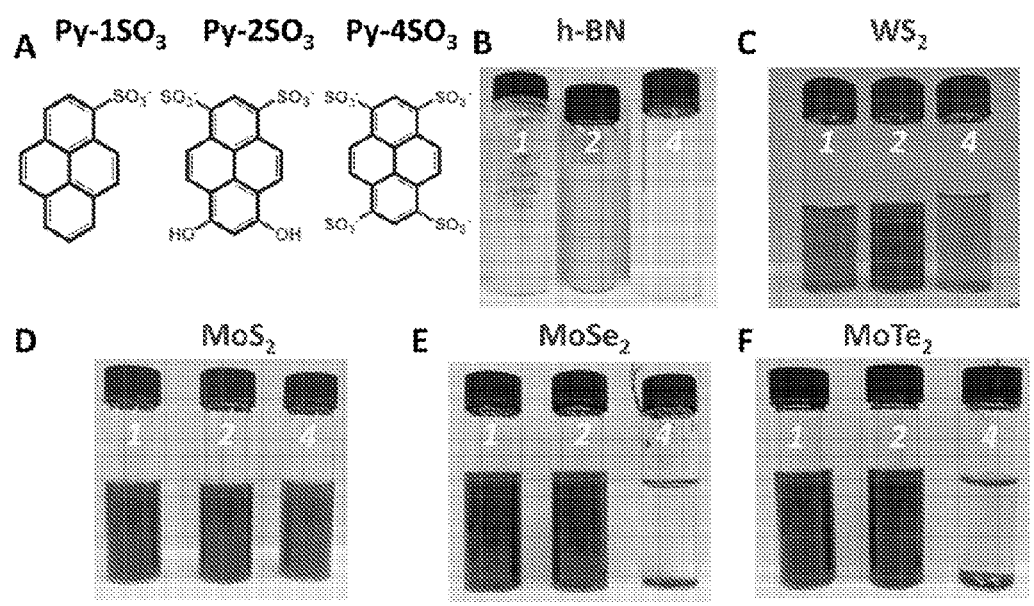
FIG. 1. A) Pyrene derivatives used in this study; B-F) Optical images of the as-prepared 2D crystals-based dispersions using pyrene derivatives (the numbers 1, 2 and 4 refer to the number of sulphonic groups of the organic dyes shown in A).

The two-dimensional or single or few layered particles formed in the processes of the first aspect of the invention may also be described as nanosheets.

The term 'two-dimensional inorganic compound' may mean an inorganic compound in a form which is so thin that it exhibits different properties than the same compound when in bulk. Not all of the properties of the compound will differ between a few-layered particle and a bulk compound but one or more properties are likely to be different. Typically, two-dimensional inorganic compounds are in a form which is single- or few layers thick, i.e. up to 10 molecular layers thick. A two-dimensional crystal of a layered material (e.g. an inorganic compound or graphene) is a single or few layered particle of that material. The terms 'two-dimensional' and 'single or few layered' are used interchangeably throughout this specification.

Two-dimensional materials are not truly two dimensional, but they exist in the form of particles which have a thickness that is significantly smaller than their other dimensions. The term 'two-dimensional' has become customary in the art.

The term 'few-layered particle' may mean a particle which is so thin that it exhibits different properties than the same compound when in bulk. Not all of the properties of the compound will differ between a few-layered particle and a bulk compound but one or more properties are likely to be different. A more convenient definition would be that the term 'few layered' refers to a crystal that is from 2 to 9 molecular layers thick (e.g. 2 to 5 layers thick). Crystals of graphene which have more than 9 molecular layers (i.e. 10 atomic layers; 3.5 nm) generally exhibit properties more similar to graphite than to graphene. A molecular layer is the minimum thickness chemically possible for that compound. In the case of boron-nitride one molecular layer is a single atom thick. In the case of the transition metal dichalcogenides (e.g. MoS$_2$ and WS$_2$), a molecular layer is three atoms thick (one transition metal atom and two chalcogen atoms). Thus, few-layer particles crystals are generally less than 50 nm thick, depending on the compound and are preferably less than 20 nm thick, e.g. less than 10 or 5 nm thick.

The term 'multi-layered particle' refers to a particle which exhibits similar properties to the same compound when in bulk. A more convenient definition would be that the term 'multi-layered particle' refers to a particle that is 10 or more molecular layers thick.

The 'inorganic compounds' referred to throughout this specification are inorganic layered compounds. Thus, the term 'inorganic compound' refers to any compound made up of two or more elements which forms layered structures in which the bonding between atoms within the same layer is stronger than the bonding between atoms in different layers. Many examples of inorganic layered compounds have covalent bonds between the atoms within the layers but van der Waals bonding between the layers. The term 'inorganic layered compound' is not intended to encompass graphene.

Many inorganic compounds exist in a number of allotropic forms, some of which are layered and some of which are not. For example boron nitride can exist in a layered graphite-like structure or as a diamond-like structure in which the boron and nitrogen atoms are tetrahedral orientated.

Examples of layered inorganic compounds to which the present invention can be applied include: hexagonal boron nitride, bismuth strontium calcium copper oxide (BSCCO), transition metal dichalcogenides (TMDCs), Sb$_2$Te$_3$, Bi$_2$Te$_3$ and MnO$_2$.

TMDCs are structured such that each layer of the compound consists of a three atomic planes: a layer of transition metal atoms (for example Mo, Ta, W . . . ) sandwiched between two layers of chalcogen atoms (for example S, Se or Te). Thus in one embodiment, the TMDC is a compound of one or more of Mo, Ta and W with one or more of S, Se and Te. There is strong covalent bonding between the atoms within each layer of the transition metal chalcogenide and predominantly weak Van der Waals bonding between adjacent layers. Exemplary TMDCs include NbSe$_2$, WS$_2$, MoS$_2$, TaS$_2$, PtTe$_2$, VTe$_2$.

The term 'hydrophilic group' means a group which has an affinity for water. A hydrophilic group is typically charge polarised and is typically capable of hydrogen bonding.

The term 'two-dimensional heterostructure' refers to a plurality of two dimensional crystals (i.e. mono- or few-layered particles) arranged in a stack. A heterostructure comprises at least two different materials (e.g. one or more inorganic compounds and/or graphene). The two dimensional crystals may be arranged such that they are substantially parallel, being arranged face-to-face, forming a laminate. Such heterostructures may also be called vertical heterostructures. Any layer of the heterostructure may be a single crystal (e.g. that formed by CVD) or it may be a thin layer of mono- or few-layered particles. Various structures may be intercalated between the crystals e.g. nanoparticles, nanotubes, quantum dots and wires. It may be, however, that the heterostructure is formed entirely of two-dimensional crystals. This does not preclude the heterostructure from being mounted on a substrate and/or have a protective coating. Nor does it preclude the possibility that nanostructures are present but are not intercalated between the layers. A two-dimensional heterostructure is so-called because it is comprised of two-dimensional crystals. A two-dimensional heterostructure may therefore be called a heterostructure of 2D crystals (i.e. mono- or few-layered particles). It will itself, of course, be a three dimensional structure. A heterostructure according to the invention may comprise graphene in addition to the inorganic layered compounds made according to the first aspect.

A layer of graphene consists of a sheet of sp²-hybridized carbon atoms. Each carbon atom is covalently bonded to three neighboring carbon atoms to form a 'honeycomb' network of tessellated hexagons. Carbon nanostructures which have more than 10 graphene layers (i.e. 10 atomic layers; 3.5 nm interlayer distance) generally exhibit properties more similar to graphite than to mono-layer graphene. Thus, throughout this specification, the term graphene is intended to mean a carbon nanostructure with up to 10 graphene layers. Graphene is often referred to as a 2-dimensional structure because it represents a single sheet or layer of carbon of nominal (one atom) thickness. Graphene can be considered to be a single sheet of graphite.

Separate aqueous dispersions of h-BN, $MoS_2$, $WS_2$, $MoTe_2$ and $MoSe_2$ were typically prepared by exfoliating the relevant starting powder in aqueous pyrene solutions with the aid of an ultra-sonic bath. Three pyrene derivatives were selected for investigation. These derivatives are functionalized with side-groups featuring different steric structure, water-solubility, electronegativity and pH response to the respective molecule as shown in FIG. 1A. The molecules are: 1-pyrenesulfonic acid sodium salt (Py-1$SO_3$), 6, 8-dihydroxy-1, 3-pyrenedisulfonic acid disodium salt (Py-2$SO_3$), and 1, 3, 6, 8-pyrenetetrasulfonic acid tetrasodium salt (Py-4$SO_3$). Compared to Py-1$SO_3$ and Py-4$SO_3$, Py-2$SO_3$ has two hydroxyl groups, —OH, so its charge can be modified by tuning the pH.

After sonication, all dispersions were centrifuged to remove unexfoliated starting powder and the supernatants were collected as shown in FIG. 1. The concentration was calculated by measuring the UV-Vis absorption of the as-prepared 2D crystal dispersions (see examples) for wavelengths >500 nm, where none of the pyrene dyes absorbs, so any increase in absorption >500 nm can be attributed to the presence of exfoliated 2D crystals. The concentrations are reported in Table 1.

In all cases Py-4$SO_3$ gives the lowest exfoliation efficiency, while Py-2$SO_3$ the highest. Without wishing to be bound by theory we believe that the hydrophobic interaction of the pyrene core with water is the key factor that facilitates the adsorption of the pyrene molecules on the surfaces. Namely, the presence of the —$SO_3$ groups polarizes the pyrene core and facilitates the electrostatic interaction of the core with the surrounding water molecules, while it reduces the hydrophobic interaction by shielding the core from the solvent environment. The overall effect is an increased solubility in water and a smaller affinity for the surfaces.

Figure 2:
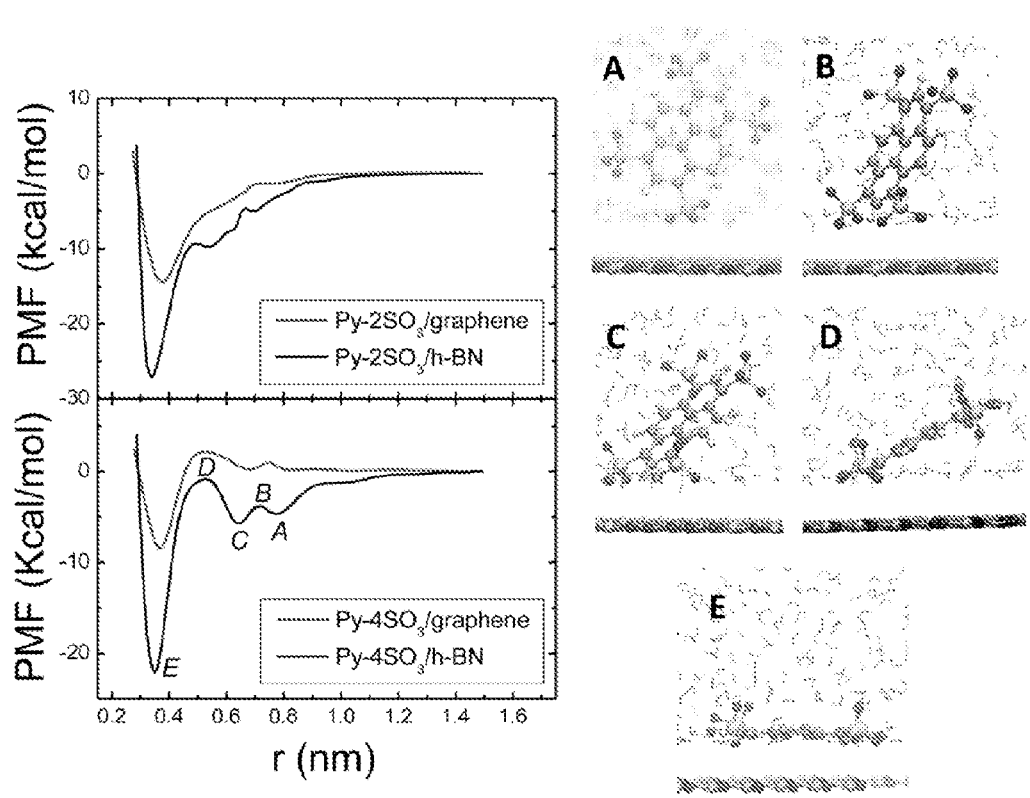
FIG. 2. Potential of Mean Force (PMF) curves of the adsorption kinetics of Py-2SO$_3$ (top panel) and Py-4SO$_3$ (bottom panel) on graphene and h-BN. The PMF curves of Py-4SO$_3$ show kinetic traps for both graphene and h-BN, which make the interaction with the surface less efficient. Simulations (see snapshots of the equilibrium structures of Py-4SO$_3$ at the points A, B, C, D, E) shows that the molecular asymmetry play a central role in favouring the approach of the pyrene towards graphene and h-BN.

FIG. 2 shows the potential of mean force (PMF) of the adsorption process of Py-2$SO_3$ and Py-4$SO_3$ on graphene and h-BN, including the snapshots of the landing of a Py-4$SO_3$ molecule as it adsorbs on the h-BN surface. FIG. 2 shows some differences between graphene and h-BN: the absolute values of the global minima energy are larger for h-BN than graphene, indicating that Py-2$SO_3$ has a higher affinity towards h-BN than graphene. This could be related to the polarity of the B—N bond, i.e. the N and B atoms are charged and there is a contribution, even if small, to the electrostatic interaction of the surface with the charged molecules. In contrast graphene has a substantially uniform electron dispersion.

We also performed exfoliation in water without using pyrene as control experiment (See examples). Table 2 shows that the exfoliation efficiency of h-BN in water is comparable to that of Py-4$SO_3$ (as expected because this type of pyrene does not contribute to the exfoliation process), but much lower than that of Py-1$SO_3$ and Py-2$SO_3$, which indicates that these pyrene molecules act as dispersant, allowing exfoliation and stabilization of the 2D crystals dispersions. Therefore, the choice of the organic dye will influence the exfoliation yield: Py-1$SO_3$ and Py-2$SO_3$ gave the best exfoliation efficiency for a large variety of 2D-crystals.

The exfoliation yield can be further increased by tuning the pH. Table 1 in the Examples reports the changes in concentration when the pH of the pyrene solution is changed by adding HCl or KOH (with corresponding change of colour). The exfoliation efficiency of Py-2$SO_3$ is highest at pH 2 and decreases strongly with increasing pH. In contrast, the concentration of BNNS/Py-1$SO_3$ did not change noticeably upon a change in pH, as expected because this organic dye is not pH sensitive. The strong dependence on the exfoliation yield on the pH can be attributed to a protonation effect. In order to confirm this idea, another control experiment was carried out by exfoliating h-BN in two different aqueous solutions without molecules at pH=2 and pH=12 under the same conditions (See Examples). The pure water-based BNNS dispersion shows that the highest concentration is obtained in neutral conditions; by adding Py-2$SO_3$ a strong pH dependence is observed: now the highest concentration is obtained at pH 2 (Table 2 in the Examples). The strong pH dependence of BNNS/pyrene suspensions is very different from the case graphene/pyrene, where all the organic dyes show the same pH dependence. In the case of graphene, the highest concentration was obtained in neutral condition and the concentration decreased heavily in acidic and basic conditions (See examples), indicating that protonation effect in the case of graphene is not fundamental to stabilize the flakes in dispersion. It should be noticed that B—N bonds in BN are more polarized than C—C bonds in graphene, and thus it will interact differently with the charged proton groups of Py-2$SO_3$.

In contrast to the above results obtained for BN, $MoS_2$ showed a pH dependence similar to that of graphene, i.e. the highest concentrations were obtained at neutral conditions, as shown in table 2 below.

The electrostatic stability of BNNS/Py-2$SO_3$ dispersion was also investigated by measuring the zeta potentials. This increases with decreasing pH (from −32.9 mV (pH 2), to −56.8 mV (pH7), to −75.7 mV (pH 12) mV, in agreement with previous results obtained with other type of molecules. The BNNS dispersions at pH 2 with zeta potential of ∼−32 mV shows the highest concentration, which is consistent with the formation of stable colloidal dispersions.

Figure 3:
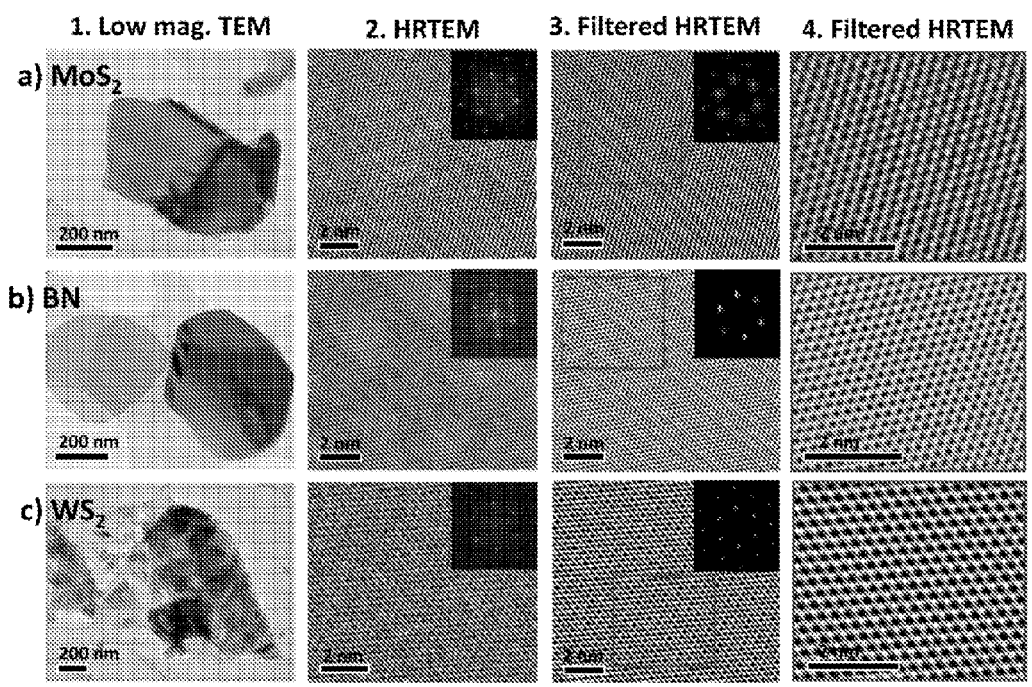
FIG. 3. TEM images of exfoliated flakes: row (A) shows exfoliated MoS$_2$ nanosheets, row (B) shows exfoliated BN nanosheets, and row (C) shows exfoliated WS$_2$ nanosheets. Column 1 shows low magnification TEM images of flakes that, in size, shape and thickness, are typical of the sample. Column 2 shows unprocessed HRTEM image with inset FFT, column 3 shows the images in column 2 after filtering. Column 4 shows sections of the image from column 3 magnified to clearly show details of the lattice fringes.

After removing the pyrene molecules with a water rinse with the aid of centrifugation, the exfoliated 2D nanosheets were characterized by transmission electron microscopy (TEM), FIG. 3. The lateral size of most flakes has been found to be less than 500 nm, but some larger sheets were also observed. The low magnification TEM images suggest that all 2D crystal compounds have been well exfoliated into monolayer and few-layer sheets. The majority of flakes are highly transparent to the electron beam and their weak contrast compared to the vacuum demonstrates that they are mostly few layer or monolayer. Lattice resolution (high resolution) TEM images shows that the sheets are clean and highly crystalline with the expected hexagonal crystal symmetry, FIG. 3. In the case of h-BN nanosheets, the relative intensities of atomic columns in the high-resolution TEM images show that the flake is single layer. For $WS_2$ and $MoS_2$ nanosheets, some of the flakes were oriented perpendicular to the beam allowing easy observation of the number of layers from the number of bright lines (FIG. 19): the majority of flakes consisted of 4-6 layers, with a lower concentration of mono- and bi-layers. Note that based on our previous studies, atomic force microscopy (AFM) does not give reliable thickness measurements because of the residual molecules adsorbed on the nanosheet.

Figure 13:
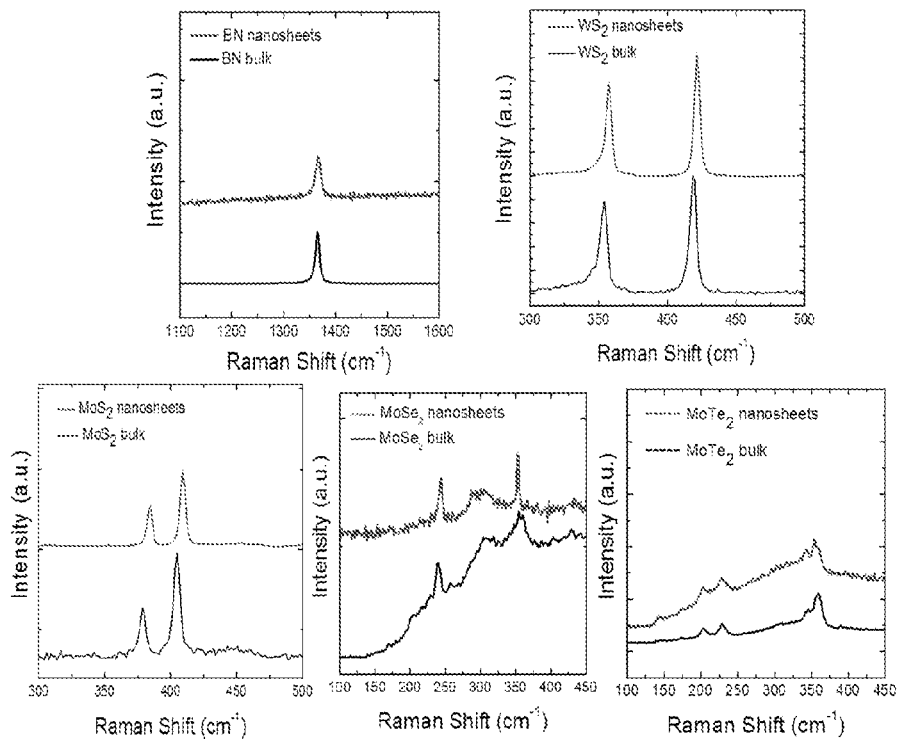
FIG. 13: Typical Raman spectra (taken at 488 nm) of as-prepared BNNS, WS$_2$ nanosheets, MoS$_2$ nanosheets, MoSe$_2$ nanosheets, and MoTe$_2$ nanosheets as compared to the corresponding bulk crystal. The intensities have been normalized.

The structure and surface chemistry of the 2D nanosheets were further investigated by Raman spectroscopy and X-ray photo-electron spectroscopy (XPS). The Raman spectra show the typical Raman features of the 2D nanosheets and in some case a weak photoluminescence background, related to the molecules residual (FIG. 13). XPS was performed on laminates produced from the 2D nanosheets suspension by using vacuum filtration (See Examples). The XPS spectra show that our exfoliation method does not oxidate the crystals and that there are residual molecules trapped in the laminate (~1-3% in the case of BNNS laminates).

Figure 4:
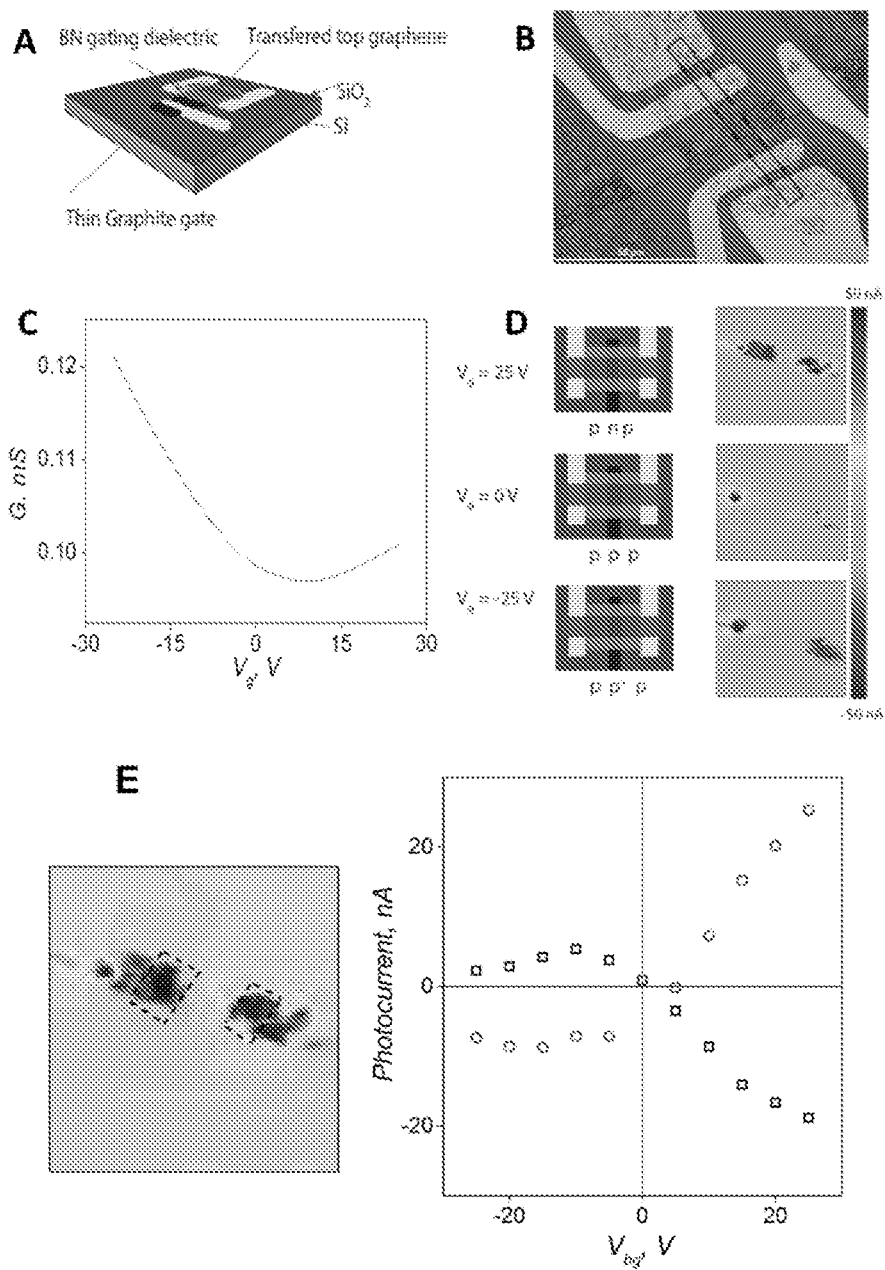
FIG. 4. (A) The basic schematic of the device; (B) an optical image of the device after fabrication; (C) Electrical measurement (thin graphite w.r.t top graphene) of as-prepared graphene device; (D) Photocurrent maps generated in the graphene device at different gate voltage: $V_g$=+25 V, $V_g$=0 V, and $V_g$=−25 V; (E) Average photocurrent calculated in the dotted squares as a function of the gate voltage.

The use of BNNS thin films prepared via the method of the first aspect in an in-plane graphene photo-detector has also been demonstrated. FIGS. 4A and 4B shows the schematic of the device, where a BN laminate is used as gating dielectric, i.e. to isolate a local gate electrode (in our case a thin graphite flake) from the top graphene flake in order to create a p-n junction in graphene, which is required to generate photocurrent upon illumination. Details of the fabrication process are provided in the Examples. FIG. 4C shows that the graphene is well isolated from the thin graphite flake and there is no detectable gate leakage in the range of +/−25 V (the thickness of BNNS laminate used in this device is ~500 nm). The charge neutrality point is shifted to around 7.5 V indicating p-type doping, which is typical for graphene transistors measured in air. Photocurrent measurements were performed using a 488 nm laser at a power of 90 µW with the laser focused to a spot size of 0.5 µm in diameter. The sample is then rastered under the laser illumination by means of a piezoelectric stage. FIG. 4D shows photo-current maps obtained at different Vg: at 0 $V_g$ (central panel) the only photo-active region is at the interface between the gold contacts and the slightly p-doped graphene, due to different work function between the two materials. At Vg=+25 V, the top graphene gets strongly n-doped, so a strong p-n junction forms at the regions of the graphene flake at the edges of the gated region. This generates an intense photocurrent signal. At Vg=−25V, the top graphene gets strongly p-doped (p+), therefore reversing the sign of the photocurrent at the p-n junctions either side of the thin graphite back gate, FIG. 4E. The average photocurrent signal as a function of Vg is shown in FIG. 4E. Finally, in order to test the use of h-BN as dielectric material, the breakdown voltage was measured in two films of different thickness of 500 nm (the device discussed above) and a second sample with 600 nm BN thickness of which we measured 4 points. We found the average breakdown electric field of the liquid-phase exfoliated h-BN to be ~0.3V/nm (in vacuum), which is similar to the one of thermally oxidized $SiO_2$ (<0.4 V/nm).

A facile and low-cost exfoliation method has been developed to prepare BN, $WS_2$, $MoS_2$, $MoSe_2$, and $MoTe_2$ thin flakes in water using commercial organic dyes. BNNS films produced by this method have a breakdown field similar to that of $SiO_2$, which allows them to be used as a gating dielectric in a graphene-based photo-detector. The versatility of the solvent-exfoliation method makes it easy to create various hybrid dispersions and films, which can be used to make low cost and mass scalable hetero-structures devices.

Figure 23:
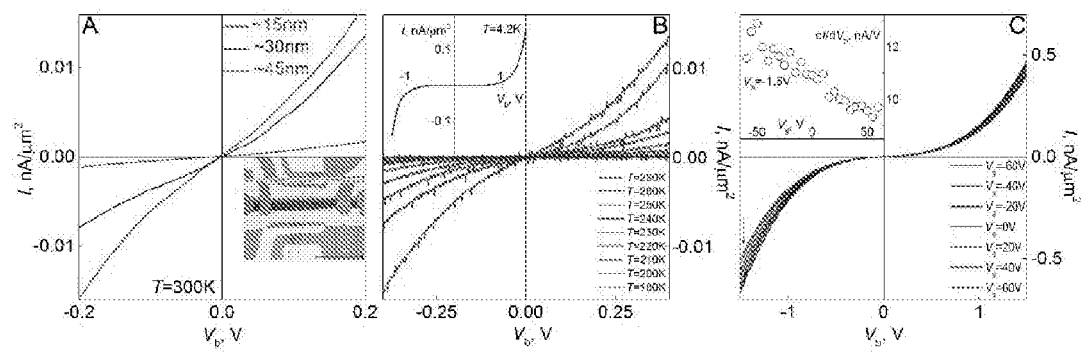
FIG. 23: (A) I-V$_b$ curves for Si/SiO$_2$/BGr/WS$_2$/TGr heterostructures with different thickness of WS$_2$. V$_g$=0V. Inset: optical micrograph of one of our devices. Boundaries of BGr (yellow, produced by drop coating) and TGr (green, mechanically exfoliated few layer graphene) are marked by dashed lines. The whitish (when on Si/SiO$_2$) or reddish (when on gold contacts) area is LPE WS$_2$. Scale bar 100 µm. (B) Temperature dependence of the I-V$_b$ characteristics of a BGr/WS$_2$/TGr device (WS$_2$ thickness ~30 nm, here we used mechanically exfoliated graphene as BGr and TGr). Inset: I-V$_b$ for the same device at T=4.2K. V$_g$=0V. (C) I-V$_b$ characteristics for the same device at different V$_g$. T=300K. Inset: Differential conductivity of the same device at V$_b$=−1.5V (marked by the blue arrow in the main panel) as a function of V$_g$.

Heterostructures can be produced based on 2D atomic crystals obtained by LPE, e.g. by the methods of the first aspect of the invention. Example of such heterostructures and devices can be created by depositing LPE 2D crystals via spray-coating and drop-coating, ink-jet printing and vacuum filtration. In particular, it would be possible to make use of graphene (Gr), transition metal dichalcogenides (TMDC, such as $WS_2$ and $MoS_2$), and hexagonal-boron nitride (h-BN) inks. These crystals have been selected because of their complementary electronic and dielectric properties, ranging from the high transparency and conductivity of graphene, to the high optical absorption of TMDC and the high transparency and resistivity of h-BN. Different types of device with the following general structure could be made: BGr/Barrier/TGr, where TGr and BGr refer to top and bottom graphene electrodes, respectively (FIG. 23). Such devices can act as (i) tunnelling transistors, where tunnelling between TGr and BGr through a barrier (typically made of h-BN or a TMDC) is controlled by a back gate; (ii) photovoltaic devices where light absorbed in the barrier (TMDC) is converted into photocurrent through TGr and BGr; (iii) in-plane transistors, where TGr is used as a gate and the Barrier as a gate dielectric to control the in-plane current in BGr.

Figure 21:
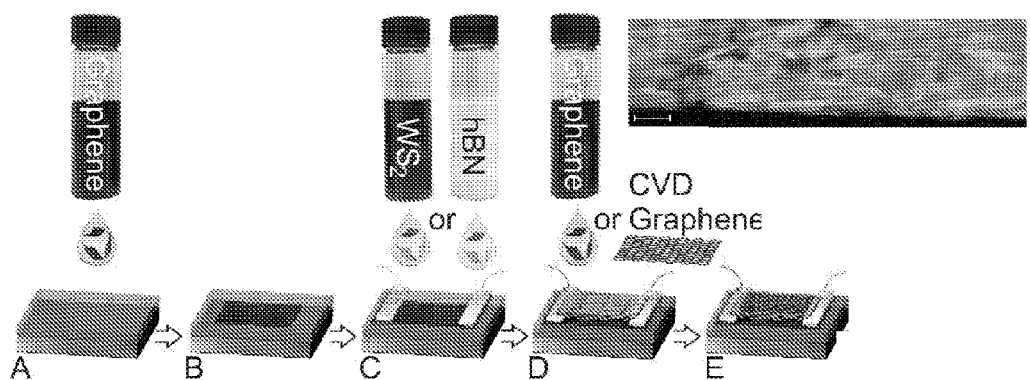
FIG. 21: Schematic of a general heterostructure device fabrication process made by using 2D-crystal inks. The dispersions in A, C and D are concentrated aqueous dispersions of (left to right) graphene, WS$_2$, h-BN and graphene. Graphene ink is deposited on a Si/SiO$_2$ substrate (FIG. 21A) to fabricate the bottom electrode (FIG. 21B). The TGr is usually composed of CVD (Chemical Vapour Deposition), LPE or mechanically exfoliated graphene (FIG. 21D,E) to ensure sufficient optical transparency.

FIG. 21 shows a schematic of a general process used to fabricate such devices: graphene ink is deposited on a $Si/SiO_2$ substrate (FIG. 21A) to fabricate the bottom electrode (FIG. 21B). Then TMDC or h-BN inks can be used to fabricate a thin film on top of the bottom electrode (FIG. 21C). TMDC and graphene inks made from exfoliation are typically composed of nanosheets with thickness between 1 and 5 monolayers. The TGr is usually composed of CVD (Chemical Vapour Deposition), LPE or mechanically exfoliated graphene (FIG. 21D,E) to ensure sufficient optical transparency. In case of using CVD or mechanically exfoliated graphene, the deposition can be done by using a dry transfer method.

Figure 22:
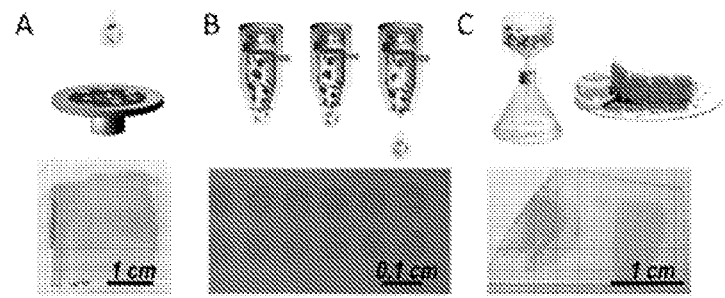
FIG. 22: Schematic representations of deposition methods for LPE 2D atomic crystals and optical micrographs of deposited films: (A) spray-coating and drop-casting on glass; (B) ink-jet printing on Si/SiO$_2$ (300 nm); (C) vacuum filtration and fishing on glass.

Three low cost and scalable methods can be used for the deposition of LPE 2D crystals: spray-coating and drop-casting, ink-jet printing, and vacuum filtration, FIG. 22. Different types of dispersions (depending of the deposition method used): from N-methylpyrrolidone-based (NMP) dispersions to aqueous dispersions obtained by using pyrene derivatives according to the methods of the first aspect of the invention. Compared to generally used NMP and DMF dispersions of graphene and other 2D crystals, such aqueous dispersions offer much faster drying rate, which is essential when using our deposition methods (for instance in low temperature post-printing processing). Aqueous dispersions are also much more environmentally friendly.

Figure 26:
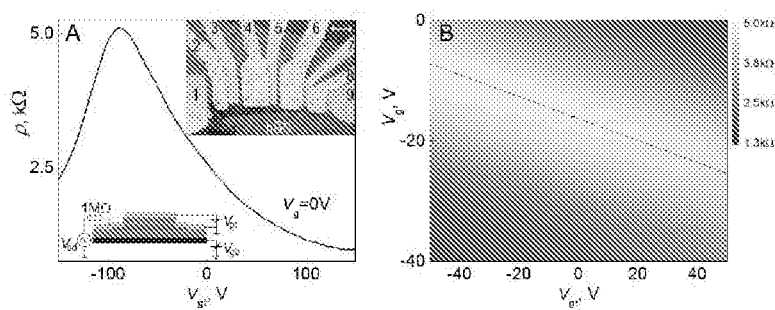
FIG. 26: (A) Resistivity as a function of $V_g$ for one of our Si/SiO$_2$/BGr/hBn/Au device (schematic in the bottom inset). T=300K. Top inset: optical micrograph of one of our device. BGr is contacted by odd-numerated contacts, and gated though LPE hBN (seen as colourful, partly transparent areas) by even-numerated contacts. Scale bar 10 µm. (B) Resistivity as a function of $V_g$ and $V_{gr}$. Dashed line indicates the position of the resistivity maximum. T=300K.

A type of heterostructure device where LPE hBN is used as a gate dielectric has also been demonstrated. The dielectric properties of hBN, added to its excellent chemical and thermal stability, mechanical and thermal properties, make hBN thin films a promising dielectric alternative in the next generation of nanodevices. Here $Si/SiO_2/BGr/hBn/Au$ devices were tested, where LPE hBN (prepared through filtering of a hBN suspension made using the methods of the invention, with subsequent transfer of the hBN paper from the filter to the device) served as transparent dielectric between the channel (BGr, CVD graphene) and the gate (Au), (FIG. 26A), inset. Mechanically exfoliated single and few layer, CVD and LPE graphene were used as a top electrode.

Resistivity of the BGr channel as a function of top gate voltage $V_{gt}$ is presented on FIG. 26A. The contour plot of the resistivity as a function of $V_g$ and $V_{gt}$ demonstrates the usual resistivity maximum shifting across a diagonal of the plot (FIG. 26B, the dashed line). The slope of the line allows us to establish the ratio of the capacitances to Si and top gate (here we ignore the finite compressibility of 2D electron gas in graphene). Knowing the thickness of hBN from the AFM study (600 nm for this particular sample), allows the estimation of the effective dielectric constant of LPE hBN to be ~1.5. The significant deviation from the bulk value (~4, as established in recent tunnelling experiments) is due to loose packing of hBN laminates. Knowing the capacitance to the top gate allows us to estimate the mobility of the BGr to be of the order of $3 \times 10^3$ cm$^2$/V·s, which is typical of CVD graphene. This clearly indicates that deposition of LPE hBN doesn't deteriorate the properties of graphene. This demonstrates that LPE hBN can be used as a dielectric for transparent, flexible transistor applications.

Illustrative TMDC Devices

Devices comprising TMDC thin films formed from suspensions of exfoliated materials have been shown to be capable of forming electronic devices, and in particular electronic devices comprising heterostructures. This is shown in the following six paragraphs. The devices described in these paragraphs have not been obtained using suspensions made according to the first aspect of the invention. It is believed, however, that they demonstrate in principal that two-dimensional materials derived from liquid phase exfoliation can form effective electronic devices.

The TMDC dispersions used for the devices in the next six paragraphs project were mostly prepared by using liquid phase exfoliation in a mixed-solvent of ethanol and DI water. In the case of $WS_2$ dispersion, 300 mg of $WS_2$ powder (2 μm, 99%, purchased from Sigma-Aldrich) were sonicated in 100 mL of 35 vol % of ethanol with DI water (18.2 MΩ, from a Milli-Q Plus system (Millipore)) for 5 days with the aid of a bath sonicator (DAWE INSTRUMENTS LTD, 6290 A300/150 W). A similar process, but with different volume fraction of ethanol in water (based on the Hansen solubility theory), was used to obtain $MoS_2$ dispersions. The starting $MoS_2$ powder: <2 μm, 99%, purchased from Sigma-Aldrich. The nanosheet dispersion was collected after centrifugation at 8000 rpm for 20 minutes. The concentration was measured by carrying out UV-Vis absorption spectroscopy (Perkin-Elmer λ-900 UV-Vis-NIR spectrophotometer) using an extinction coefficient $\alpha_{626\ nm}$=2756 L g$^{-1}$ m$^{-1}$ for $WS_2$ and $\alpha_{672\ nm}$=3400 L g$^{-1}$ m$^{-1}$. This gives a concentration around 0.04 mg/mL for the $WS_2$ dispersion and 0.056 mg/mL for the $MoS_2$ dispersion.

Tunnelling junctions and tunnelling transistors which have a structure of Si/SiO$_2$/BGr/WS$_2$/TGr ($MoS_2$-based devices demonstrate similar characteristics) have been prepared. Tunnelling junctions may have both BGr and TGr produced by either of the methods mentioned above, whereas tunnelling transistors require exactly monolayer graphene to be used as BGr in order not to screen the gate voltage (and as such are prepared from CVD or mechanically exfoliated graphene). The current-bias voltage (I-$V_b$) characteristics for these devices are strongly non-linear (FIG. 23). As expected, the zero-bias conductivity goes down as the thickness of $WS_2$ layer increases (FIG. 23A). The uncertainty in the thickness of the layer (RMS roughness ~3 nm) prevents any quantitative analysis of the scaling behaviour. Zero-bias conductivity also decreases dramatically with decreasing temperature, (FIG. 23B). Such a strong temperature dependence suggests an excitation mechanism for charge carrier generation, either from the graphene electrodes (in this case the tunnelling barrier is the Schottky barrier between graphene and $WS_2$) or from the impurity band in $WS_2$ (a strong impurity band is expected due to the large fraction of edges in our nanocrystals of $WS_2$). The strong increase in the current for $V_b$>1V even at low temperatures (FIG. 23B inset) suggests over-barrier transport between graphene and $WS_2$.

For devices where BGr was made of monolayer graphene, gating with the Si back gate (through 300 nm SiO$_2$) is possible, FIG. 23C. The zero-bias resistance is not sensitive to the back gate voltage $V_g$ applied, whereas the current in the non-linear region demonstrates a 30% modulation when $V_g$ is swept between −60V and 60V. The fact that the gate voltage mostly affects the non-linear part of the I-$V_b$ dependence indicates that the changes in the current are mostly due to the changes in the relative position of the Fermi energy with respect to the top of the valence band in $WS_2$ (as has been previously suggested for tunnelling transistors produced from monocrystalline $WS_2$ and not due to the gating of $WS_2$. Note, that from the slope of the conductivity versus $V_g$ one can conclude that it is hole transport through the valence band of $WS_2$, which dominates the current, contrary to the conclusion of, where monocrystalline $WS_2$ has been used. It might be due to the fact that the Fermi level in small flakes of $WS_2$ is pinned close to the valence band by the edge states.

Similar structures have been used for photovoltaic applications. Again, this discussion is limited to Si/SiO$_2$/BGr/WS$_2$/Gr type heterostructures, although this has also been carried out with $MoS_2$. Upon illumination, electron-hole pairs generated mostly in the TMDC layer (due to its high optical absorption) can decay into separate electrodes (provided there is an electric field to separate the charges), producing a photovoltage. Under illumination the I-$V_b$ characteristics become increasingly linear, FIG. 26 (inset), demonstrating that in this regime the current is dominated by the photo-excited carriers. Also, finite photocurrent has been observed even at zero bias voltage (FIG. 26 inset to left panel), demonstrating that such structures can be indeed used as photovoltaic devices.

Figure 24:
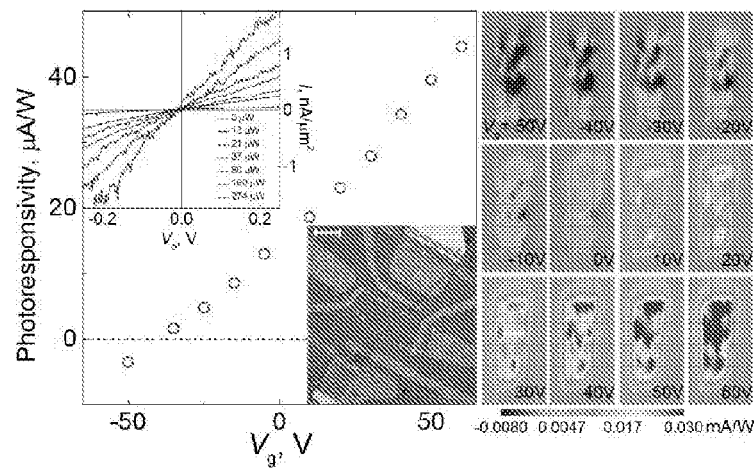
FIG. 24: Photoresponsivity (zero-bias photocurrent) of a Si/SiO$_2$/BGr/WS$_2$/TGr device as a function of V$_g$. Each point is obtained by averaging the zero bias photocurrent maps (right panel). The photocurrent changes sign at V$_g$≈−40V, indicating reversing in the direction of the built in electric field. Top inset: I-V$_b$ characteristics of the device at different laser powers. Bottom inset: optical micrograph of one of our devices. Boundaries of BGr (yellow) and TGr (green) are marked by dashed lines. Both BGr and TGr are produced by transferring mechanically exfoliated graphene. Greenish (when on Si/SiO$_2$) or reddish (when on gold contacts) area is LPE WS$_2$. Scale bar 10 µm. Right panel: spatial maps of the zero bias photocurrent for the same device, taken at different values of V$_g$. The width of each map is 10 µm. Incident power 56 µW, laser energy 1.96 eV.

Zero-bias photocurrent was recorded as a function of the position of the laser spot (less than 1 μm in diameter) on the device by using a 100× microscope objective. Zero-bias photocurrent maps, taken at different back gate voltages, demonstrate that the photocurrent is produced only in the regions where all three layers (BGr, TMDC and TGr) overlap. Similar to the case of the transistor, the back gate voltage controls the value and the direction of the electric field across $WS_2$, and thus the magnitude and the polarity of the photocurrent, (FIG. 24). For the largest electric field across $WS_2$ (at $V_g$=60V) we used—we achieved a photoresponsivity values of ~0.1 mA/W. The efficiency could still be increased by using larger flakes, which would reduce the contribution of recombination mechanisms. These devices do not require exactly monolayer TMDC to be used, which simplifies the procedure even further. Using thicker flakes (2-10 layers) means that those would also be larger laterally (allowing for more efficient e-h separation), as well as ensuring that the band-structure of TMDC used has a non-direct band-gap, also reducing the probability of recombination.

Figure 25:
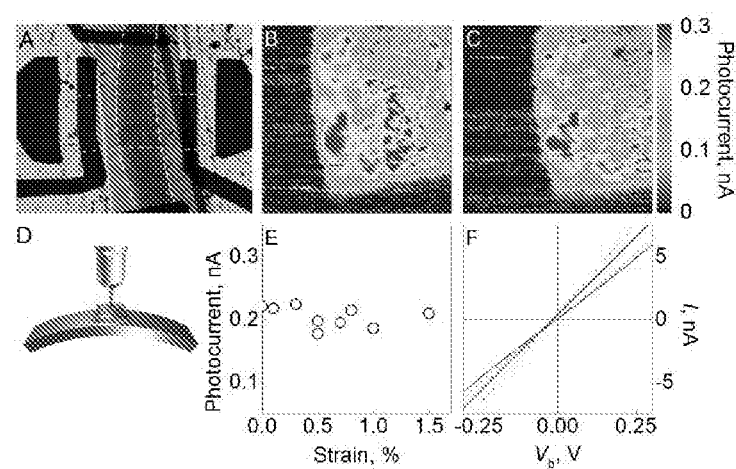
FIG. 25: (A) Optical micrograph of a LPE PET/BGr/WS$_2$/TGr heterostructure. The yellow dotted lines indicate the boundaries of LPE BGr; the green dotted lines—CVD TGr; the red square shows the area investigated by photocurrent mapping (size 70 µm×70 µm). The brownish stripe which covers the BGr is 60 nm LPE WS$_2$. Photocurrent maps (70 µm×70 µm) taken at an incident power of 190 µW and energy of 1.96 eV at two different curvatures: 0 mm$^{-1}$ (B, corresponds to zero strain) and 0.15 mm$^{-1}$ (C, corresponds to 1.5% strain). (D) schematic representation of our bending set-up. (E) Average photo-current obtained from the photo-current maps as a function of the applied strain. (F) I-$V_b$ characteristics with (red) and without (blue) illumination for the strained (solid curves) and unstrained (dashed curves) cases. The illumination (power 190 µW) was focused into ~1 µm² spot.

Although the photoresponsivity of these devices is significantly smaller than that obtained in known photovoltaic devices or in similar heterostructures based on monocrystalline $WS_2$, the advantage of these structures is that they can be produced by different cheap and scalable methods, and are compatible with flexible substrates. Thus PET/BGr/WS$_2$/TGr heterostructures were fabricated on a flexible PET substrate (thickness 0.2 mm) (FIG. 25A). Two different methods were tested for sample fabrication: BGr and $WS_2$ layers were produced by either drop-casting or vacuum filtering (with subsequent wet transferring) of the respective LPE dispersion. Both layers were shaped into strips by mechanical removal of the unnecessary material, (FIG. 25A). We used CVD graphene as TGr to achieve maximum optical transparency. A 4-point bending rig was utilised to apply uniaxial strain to the heterostructure, (FIG. 25D).

As in the previous experiment a laser was scanned across the sample while simultaneously recording the photocurrent, (FIG. 25B,C). The photocurrent is only observed when illuminating the area where all three layers (BGr, $WS_2$ and TGr) overlap. After bending, some local variation in the photocurrent was detected. However, the overall pattern (FIG. 25B, C), the integral value of the photocurrent (FIG. 25E) and the overall resistance of the device (FIG. 25F)

remain practically independent of the strain, demonstrating the possibility to use such heterostructures for flexible electronics.

The TMDC dispersions used for the devices in the previous six paragraphs project were mostly prepared by using liquid phase exfoliation in a mixed-solvent of ethanol and DI water. In the case of $WS_2$ dispersion, 300 mg of $WS_2$ powder (2 μm, 99%, purchased from Sigma-Aldrich) were sonicated in 100 mL of 35 vol % of ethanol with DI water (18.2 MΩ, from a Milli-Q Plus system (Millipore)) for 5 days with the aid of a bath sonicator (DAWE INSTRUMENTS LTD, 6290 A300/150 W). A similar process, but with different volume fraction of ethanol in water (based on the Hansen solubility theory), was used to obtain $MoS_2$ dispersions. The starting $MoS_2$ powder: <2 μm, 99%, purchased from Sigma-Aldrich. The nanosheet dispersion was collected after centrifugation at 8000 rpm for 20 minutes. The concentration was measured by carrying out UV-Vis absorption spectroscopy (Perkin-Elmer λ-900 UV-Vis-NIR spectrophotometer) using an extinction coefficient $\alpha_{629\ nm}$=2756 L $g^{-1}$ $m^{-1}$ for $WS_2$ and $\alpha_{672\ nm}$=3400 L $g^{-1}$ $m^{-1}$. This gives a concentration around 0.04 mg/mL for the $WS_2$ dispersion and 0.056 mg/mL for the $MoS_2$ dispersion.

Methods of Preparing of Thin Films/Laminates of TMDCs

Nanosheet-based thin films can be fabricated from the dispersions formed in the first aspect of the invention using a wide variety of methods. These methods include: (i) vacuum filtration; (ii) drop-casting; (iii) spray-coating; (iv) ink-jet printing.

Vacuum Filtration

Thin films can be fabricated by vacuum filtration of the as-prepared dispersions. The thickness of the film is controlled by using the "delamination and fishing method": the laminate supported on the cellulose filter is vertically immersed in deionized (DI) water, which allows a thin section of the TMDC (e.g. $WS_2$) film to delaminate and to appear as a free-standing film on the water surface.

The floating TMDC (e.g. $WS_2$) film can finally be collected by 'fishing' with arbitrary substrates, including $Si/SiO_2$, plastics and quartz. This method allows us to control the thickness of the TMDC (e.g. $WS_2$) films by stacking several thin films together, for example obtained by sequential delamination of the same laminate. However, it may be that the thinnest films contain a proportion of holes, making a single delaminated film (N=1) unsuitable for the fabrication of the heterostructures. By sequentially stacking the delaminated layers, the holes are covered. With a minimal chance of the holes overlapping, the staked layers constitute a homogenous barrier and the film becomes suitable for device fabrication.

Drop Casting

A drop casting process can be used to produce large-area thin films. In the case of h-BN thin films, the dispersion is drop cast onto a preheated $Si/SiO_2$ substrate at 90° C. The thickness of the film depends on the volume of the droplet, concentration of the dispersion, and the contact angle of the substrate. The thin film can be transferred onto any other substrate for device fabrication. It is worth noting that, if desired, the $Py-1SO_3$ molecules can be washed away using water with the aid of centrifugation before preparing the thin films. Large-scale TMDC (e.g. $WS_2$) thin films can also be fabricated by the same method but the temperature should be kept below 60° C. to avoid aggregation and structural modification by reaction with air.

Ink-Jet Printing

A Dimatix DMP-2800 inkjet printer can be used (Fujifilm Dimatix, Inc., Santa Clara, USA). This can create and define patterns over an area of about 200×300 mm and handle substrates up to 25 mm thick being adjustable in the Z direction. The temperature of the vacuum platen, which secures the substrate in place, can be adjusted up to 60° C. Additionally, a waveform editor and a drop-watch camera system allows manipulation of the electronic pulses to the piezo jetting device for optimization of the drop characteristics as it is ejected from the nozzle. The nozzle plate consists of a single row of 16 nozzles of 23 μm diameter spaced 254 μm with typical drop size of 10 pL. The most remarkable feature of the printer is the possibility of varying the distance between two consecutive droplets, the so-called dot spacing, a parameter that has an effect in the continuity, width and thickness of printed features.

Device Fabrication

Devices can be fabricated from the dispersions formed in the first aspect and from the thin films described above. Illustrative examples include those having the structure: top electrode/Liquid-phase exfoliated TMDC/bottom electrode. Both gold and graphene can be used to serve as the bottom electrode. Different types of graphene can be used in the devices: micro-mechanically exfoliated (MME), chemical vapour deposited (CVD), single-layers to few-layer graphene (FLG) and graphene laminates made by liquid-phase exfoliation (LPE). A combination of wet and dry transfer methods can be used to construct the hetero-structures.

Gold/TMDC/Graphene

Gold strips (W×H: 2 μm×60 nm) can be deposited onto a $Si/SiO_2$ substrate using photolithography. The liquid-phase exfoliated TMDC film as prepared could then be fished onto a second $Si/SiO_2$ wafer. For multilayer thin films the fishing process can be repeated multiple times until the holes density is strongly reduced. In the final step a MME or CVD graphene sheet can be transferred on top of the whole structure by standard transfer technique (dry for MME-Gr and wet for CVD-Gr). Hetero-structures using both $WS_2$ and $MoS_2$ as the photoactive material can be prepared.

MME-Gr/TMD/MME-Gr

Firstly a graphene flake can be deposited onto a $Si/SiO_2$ substrate via MME after which Cr/Au (5 nm/70 nm) contacts can be deposited using photolithography. Drop-casting, spray-coating, and direct fishing can be used to place the TMDC film on the MME graphene. For the direct fishing, the liquid-phase exfoliated TMDC film can be fished onto a second $Si/SiO_2$ wafer. For multilayer thin films the fishing process can be repeated multiple times until the hole density is at a desired level, i.e. to obtain a density which provide a tolerable risk of the device shorting.

The resulting thin film of TMDC can be examined by optical microscopy to select a hole free region and can then be hatched to the desired size of the target device. This can then be transferred onto the target graphene device by wet transfer methods. In the final step a graphene sheet can be transferred on top of the whole structure by dry transfer technique.

Devices with LPE Graphene and CVD Graphene as Electrodes

Heterostructures can also be fabricated using CVD graphene and LPE graphene laminates.

LPE graphene can be either spray coated or drop cast onto a $Si/SiO_2$ or PET substrate and excess material can be removed leaving thin strips which serve as the bottom electrode. Contacts can then be patterned onto the LPE graphene. A TMDC layer can then be transferred onto the LPE graphene strip. CVD graphene on copper can be etched in 0.1 M aqueous solution of ammonium persulfate contained in a Petri dish for 6 hrs, the CVD graphene can then be transferred onto the device completing the heterostructure.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

EXAMPLES

1 Materials

Boron nitride powder (~1 micro, 99%), Tungsten disulphide powder ($WS_2$, 2 μm, 99%) and Molybdenum disulfide powder ($MoS_2$, <2 μm, 99%) were purchased from Sigma-Aldrich.

Molybdenum selenide ($MoSe_2$, 99.9%, 325 mesh) and Molybdenum telluride ($MoTe_2$, 99.9%, 10 microns) were purchased from MATERION ADVANCED CHEMICALS INC.

1-pyrenesulfonic acid sodium salt (Py-1$SO_3$, >97.0% (HPLC)), 6, 8-dihydroxy-1, 3-pyrenedisulfonic acid disodium salt (Py-2$SO_3$, >97.0% (HPLC)), and 1, 3, 6, 8-pyrenetetrasulfonic acid tetrasodium salt (Py-4$SO_3$, >97.0% (HPLC)), Hydrochloric acid (HCl, ACS reagent, 37%) and Potassium hydroxide (KOH, pellets, 99.99%) were purchased from Sigma-Aldrich.

Unless otherwise stated, other reagents were of analytical grade and were used as received. All aqueous solutions were prepared with ultra-pure water (18.2 MO) from a Milli-Q Plus system (Millipore).

2 Characterization Techniques

Samples for TEM characterization were prepared in the following way: the aqueous solutions containing the nanosheets were sonicated prior to being drop cast onto holey carbon support grids. Flake size was assessed using low magnification bright field TEM imaging in a Philips CM20 TEM operated at 200 kV. High resolution TEM imaging was performed using a probe side aberration corrected FEI Titan G2 operated at 200 kV with an X-FEG electron source. High angle annular dark field (HAADF) scanning transmission electron microscope (STEM) imaging was performed in the same instrument with convergence angle of 26 mrad and a HAADF inner angle of 52 mrad and a probe current of ~200 pA. Energy dispersive x-ray (EDX) spectroscopy was performed in the Titan using a Super-X EDX detector with a collection solid angle of 0.7 srad.

X-ray photoelectron spectroscopy (XPS) was performed using an ESCALAB 250 Xi from Thermo. The pass energy was set to 20 eV and the spot size was ~900 μm. We used the flood gun for charge compensation and calibrated the binding energy on the carbon 1s peak at 285.0 eV. Raman spectroscopy was performed at 488 nm by using a Witec alpha 300 Raman spectrometer. UV-Vis absorption spectra were obtained by using (Perkin-Elmer λ-1050 UV-vis-NIR spectrophotometer). Zeta Potential measurement was performed on BNNS dispersions by using Malvern ZetaSizer Instruments. Each zeta measurement is the average of 3 results.

The photocurrent maps were obtained by combing our Witec system together with a Keithley Nanovoltmeter and a Keithly Sourcemeter. The laser ($\lambda_{ex}$=488 nm) of Witec system acts as the light source after one long distance 100× objective (NA=0.6). The doping level of graphene is tuned by applying a gate voltage through the sourcemeter.

3 Experimental Methods 3.1 Exfoliation Process

Figure 5:
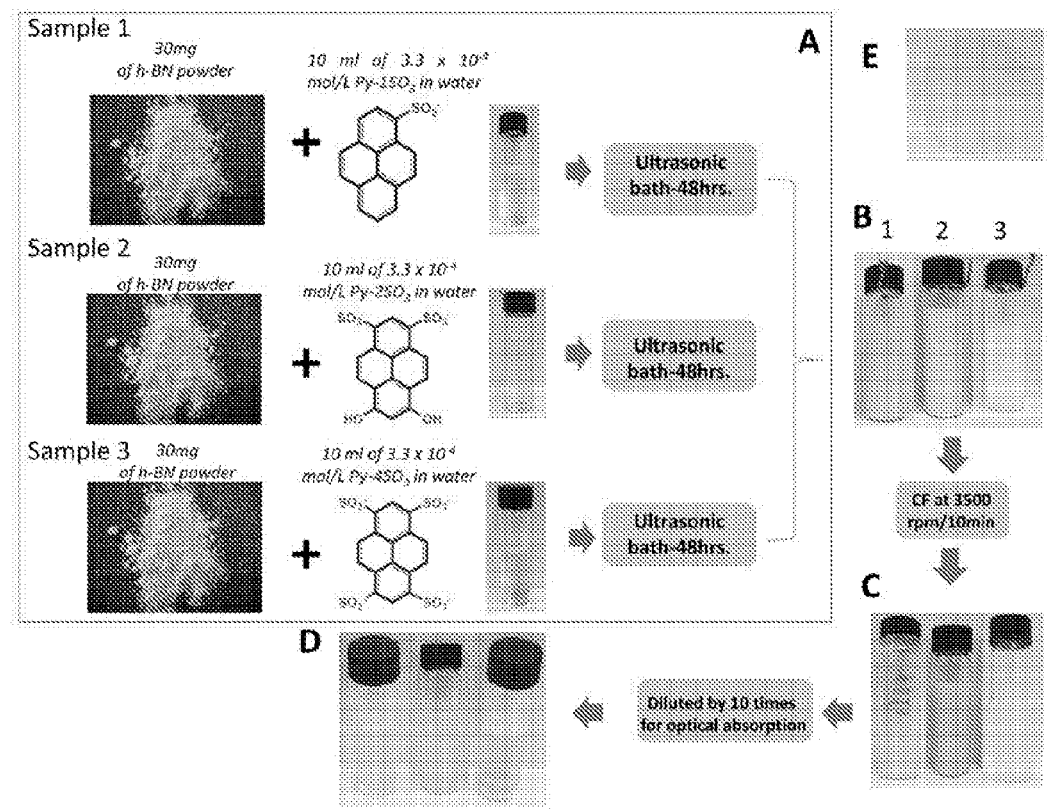
FIG. 5: (A) Schematic of the exfoliation process of h-BN by using Py-1SO$_3$, Py-2SO$_3$ and Py-4SO$_3$ in DI water. (B) Optical image of three samples after sonication (the numbers 1, 2, 3 refer to Sample 1, 2 and 3, respectively, in A). (C) Optical image of three samples after centrifugation at 3500 rpm for 10 mins. (D) Optical image of three samples diluted 10 times (used for optical absorption measurements). (E) Optical image of a h-BN film obtained by filtering 40 ml of BNNS@Py-1SO$_3$ dispersion.

A schematic of the process for h-BN is shown in FIG. 5. Briefly, the three aqueous pyrene derivatives solutions are prepared by dissolving pyrene powders in 10 ml of deionised (DI) water at a concentration of $3.3 \times 10^{-4}$ mol/L. Then the starting BN powders (3 mg/mL) were mixed with the as-prepared aqueous pyrene solutions. Finally, the mixtures were sonicated for 48 hrs and then centrifuged (3500 rpm for 10 minutes). After separation, a milky yellowish dispersion is obtained, FIG. 5 (C). The yellowish colour is due to the presence of pyrene, as compared to typical h-BN milky dispersions.[1]

The $MoS_2$, $WS_2$, $MoTe_2$ and $MoSe_2$ dispersions were prepared by using the same exfoliation process. The 2D nanosheets dispersions were stable, with no evidence of sedimentation for at least a few weeks. However, we observed that h-BN, $MoS_2$ and $WS_2$ tend to be more stable than $MoTe_2$ and $MoSe_2$.

3.2 Effect of Solvent

TABLE 1

The effect of the solvent was tested for the exfoliation of $MoS_2$ with Py-1SO3:

| Sample (sonicated for 24 hrs) | Concentration(mg/mL) (following centrifugation at 1500 rpm for 20 mins) |
|---|---|
| 0.5 mg/mL of Py-1SO3 in water | 0.016 |
| 0.5 mg/mL of Py-1SO3 in MeOH | 0.0056 |
| 0.5 mg/mL of Py-1SO3 in MeOH:water 20:80 | 0.022 |
| in MeOH:water 20:80 (no pyrene) | 0.011 |
| in MeOH (no pyrene) | 0.005 |

3.3 Laminates and Thin Films Preparation

Figure 6:
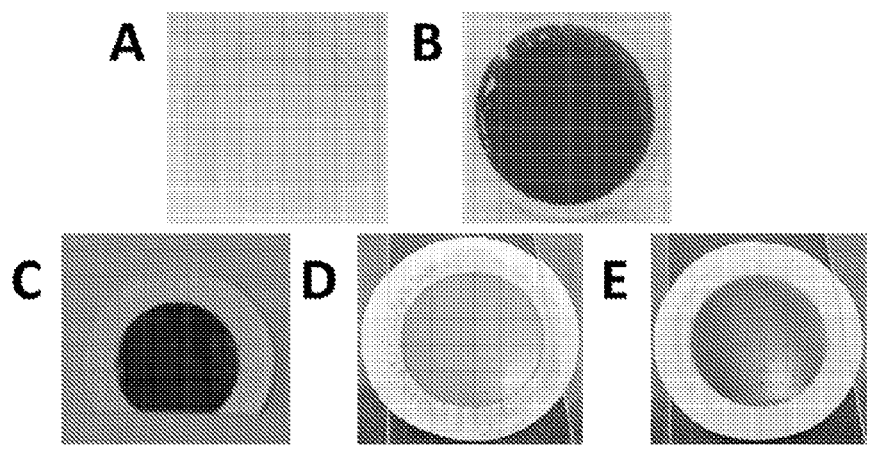
FIG. 6: Optical images of: A) h-BN free standing film, B) WS$_2$, C) MoS$_2$, D) MoSe$_2$, and E) MoTe$_2$ thin films supported on the filter.

Thin films were prepared by vacuum filtration immediately after centrifugation. In the case of BNNS laminates, 40 mL of BN nanosheets dispersions was filtered through nitrocellulose membranes (pore size 0.3 μm) to get a free standing BN film. The deposited films were washed with 100 ml of DI water to remove the pyrene molecules and the BN film can be peeled off from the membrane when it was dried on a hotplate at 60 degrees. For the other materials, only 8 mL of as-prepared dispersions were deposited on the membranes to get the thin films, respectively. These can also be peeled off by dissolving the cellulose membranes using acetone vapour after they get dry. All the 2D crystal-based films in this work are shown in FIG. 6.

3.4 Characterization 3.4.1 Optical Absorption Spectra

Figure 7:
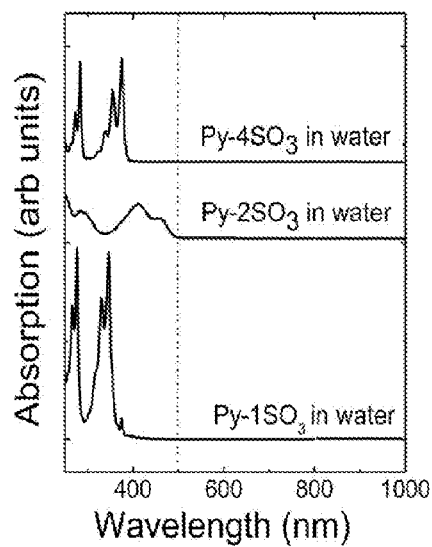
FIG. 7. Optical absorption spectra of the three pyrene derivatives aqueous solutions. The spectra have been translated for the sake of clarity

UV-Vis spectroscopy has been used to get the concentration of the suspension and to study the interaction between the molecules and the 2D crystals. Since the molecules show characteristic peaks at short wavelengths, FIG. 7, the absorption coefficient measured above 500 nm was used (h-BN— 550 nm-1000 L $g^{-1}$ $m^{-1}$; $MoS_2$—672 nm-3400 $g^{-1}$ $m^{-1}$; $WS_2$—629 nm-2756 L $g^{-1}$ $m^{-1}$) in order to find the concentration (Table 2).

TABLE 2

Concentrations of as-prepared h-BN, $WS_2$, $MoS_2$, $MoSe_2$, and $MoTe_2$ dispersions using three different pyrene derivatives. $WS_2$, $MoS_2$, $MoSe_2$, and $MoTe_2$ dispersions were made at pH = 7.

| | Concentration (mg/mL) | | |
|---|---|---|---|
| | Py-1$SO_3$ | Py-2$SO_3$ | Py-4$SO_3$ |
| h-BN | 0.113 (pH 2) | 0.544 (pH 2) | 0.048 |
| | 0.104 (pH 7) | 0.347 (pH 7) | |
| | 0.102 (pH 12) | 0.207 (pH 12) | |
| h-BN* | 0 (pH 2) | | |
| | 0.079 (pH 7) | | |
| | 0.026 (pH 12) | | |
| $WS_2$ | 0.04 | 0.1 | 0.007 |
| $MoS_2$ | 0.036 | 0.11 | 0.02 |
| | 0.042 ($2^{nd}$ run: pH 7) | | |
| | 0.008 (pH 2) | | |
| | 0.016 (pH 12) | | |
| $MoTe_2$ | 1.1 | 1.2 | — |
| $MoSe_2$ | 0.8 | 1.1 | — |

*Control experiment (without polycyclic aromatic compounds)

Figure 8:
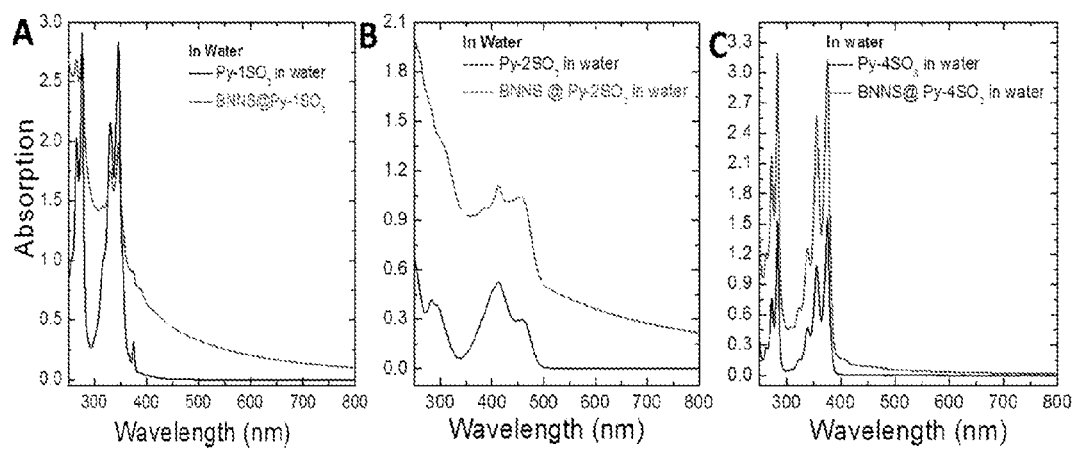
FIG. 8: The optical absorption spectra of: (A) Py-1SO$_3$ solution in water (Black line) and BNNS@Py-1SO$_3$ dispersion in water (Red line), (B) Py-2SO$_3$ solution in water (Black line) and BNNS@Py-2SO$_3$ dispersion in water (Red line), (C) Py-4SO$_3$ solution in water (Black line) and BNNS@Py-4SO$_3$ dispersion in water (Red line).

FIG. 8 shows the absorption spectra of the BNNS dispersions obtained with Py-1$SO_3$, Py-2$SO_3$ and Py-4$SO_3$, as compared to the spectra of the suspensions made only with water and molecules. The concentrations of BNNS dispersions shown in Table 2 were calculated by using the optical absorption at 550 nm. Note that the baseline of BNNS@Pyrene is not flat compared to that of pure molecules due to the presence of BNNS, as previously observed for graphene.

Figure 9:
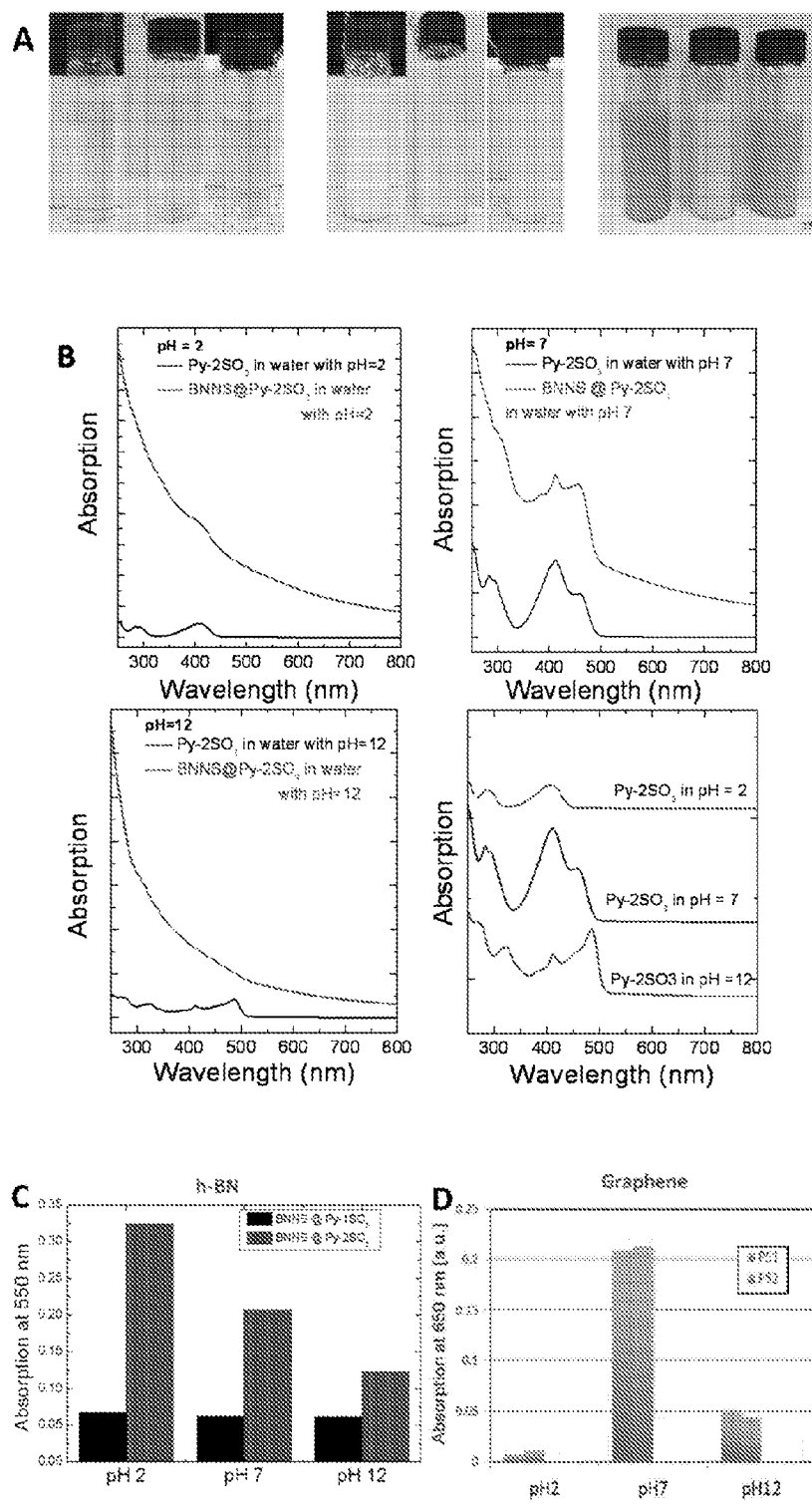
FIG. 9: (A) Left panel: Optical images of Py-2SO$_3$ aqueous solutions at pH=2, 7, 12 moving from left to right; (middle panel) optical images of the BNNS@Py-2SO$_3$ dispersions at different pHs (2, 7, 12 moving from left to right) before sonication; (right panel) optical images of the as-prepared BNNS@ Py-2SO$_3$ dispersions after sonication and centrifugation. (B) Optical absorption spectra of BNNS@Py-2SO$_3$ at different pH, as compared to the absorption spectra of the acqueous solution at the same pH; (C) absorbance at 550 nm measured for the BNNS@Py-2SO$_3$ at different pH; (D) absorbance obtained for graphene@pyrene, taken from Ref. 3 (PS1=Py-1SO$_3$; PS2=Py-2SO$_3$).

FIG. 9 (A) shows the dispersions of BNNS@pyrene using different pHs. The suspension changes in colour when the pH of aqueous pyrene solutions is tuned by adding HCl or KOH solutions before mixing with the BN bulk: while the BN is milky white, Py-2$SO_3$ is fluorescent green, the obtained BNNS@Py-2$SO_3$ is salmon for pH=2 but it is lemon yellow for pH=12. FIG. 9 (B) shows the corresponding absorption spectra. FIG. 9 (C-D) compare the pH dependence on the exfoliation yield of BNNS and graphene. We can observe that h-BN and graphene suspensions show different pH response: in the case of graphene, the highest concentration is obtained in neutral condition, no matter the organic dyes used; in contrast, for h-BN the highest concentration is obtained at low pH and only with Py-2$SO_3$. The concentration of graphene@pyrene dispersions is due to the colloidal stabilization and it is not relevant to protonation effect. However, in the case of h-BN, protonation effect plays an important role in stabilizing the h-BN flakes in suspensions.

Figure 10:
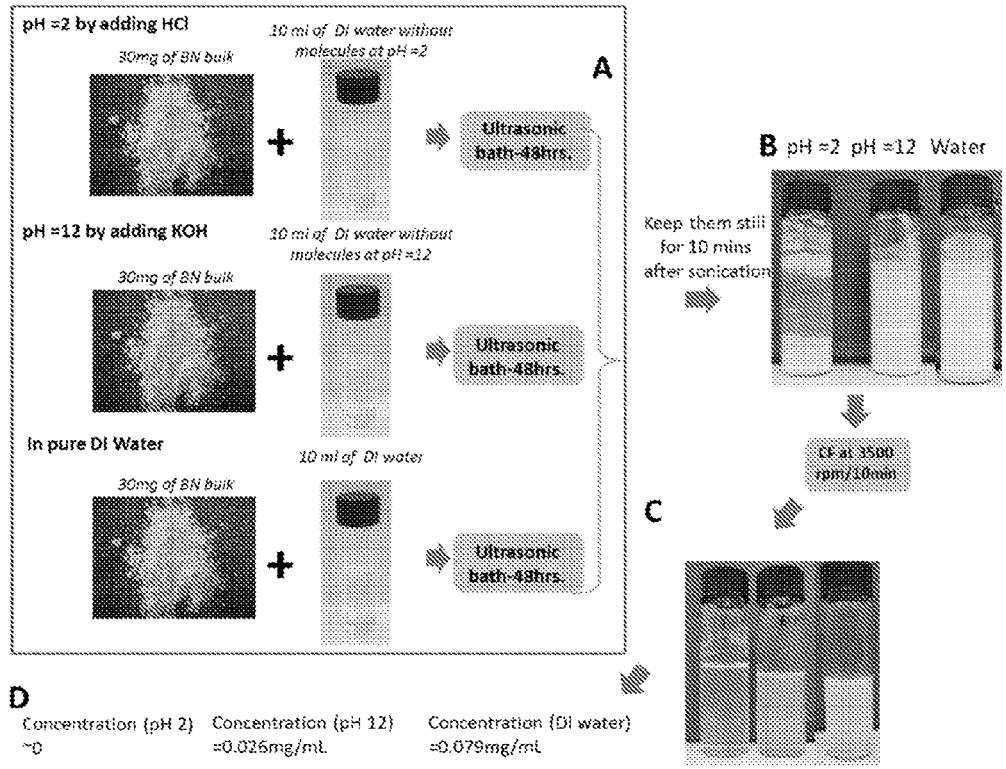
FIG. 10: (A) Three BN dispersions were exfoliated directly in DI water with pH=2 (HCl), pH=12 (KOH), and pure DI water (pH=7), respectively. (B) The optical image of the three samples after sonication. (C) Optical image of the three samples after centrifugation at 3500 rpm for 10 mins. (D) Concentrations of BNNS@HCl (pH 2), BNNS@KOH (pH 12), and BNNS@ DI water are calculated based on the UV-Vis spectra of BNNS dispersion.
Figure 11:
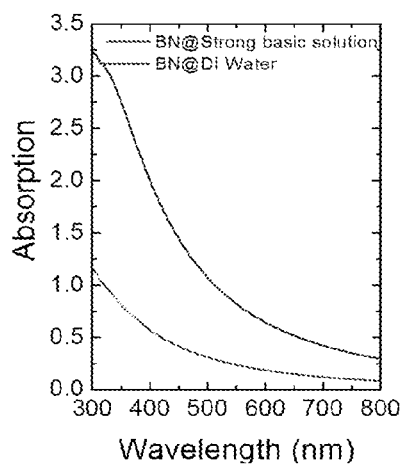
FIG. 11: The optical absorption spectra of (red) BNNS@ strong basic solution dispersion and (blue) BNNS@ DI water dispersion.

In order to verify that the changes in the exfoliation yield are related to the use of the pH-sensitive organic dyes, we performed also a control experiment, by sonicating BNNS in three different aqueous solutions without molecules at pH=2, pH=12, and pure DI water, under the same conditions. The schematic of the process is shown in FIG. 10. After centrifugation as shown in FIG. 100, the dispersion at pH=2 is transparent, i.e. HCl does not exfoliate at all. In contrast, the dispersions obtained at pH=12 and DI water (pH=7) show the presence of BNNS. Furthermore, no change in colour has been observed, which further confirms that the colour of BNNS@Py-2$SO_3$ is consequence of the direct interaction between BNNS and Py-$SO_3$. Note that the colour change in strong acidic conditions is similar to the previous report on BNNS and $CH_3$—$SO_3H$. The absorption spectra of BNNS without pyrene at pH=12 and DI pure water are shown in FIG. 11 and concentrations calculated based on the optical absorption are 0.026 mg/mL and 0.079 mg/mL, respectively. This is much lower than that of BNNS@Pyrene (Table 1). Therefore, the control experiment results show that the molecules play an important role in enhancing the exfoliation yield and in stabilizing the nanoflakes in water.

Figure 12:
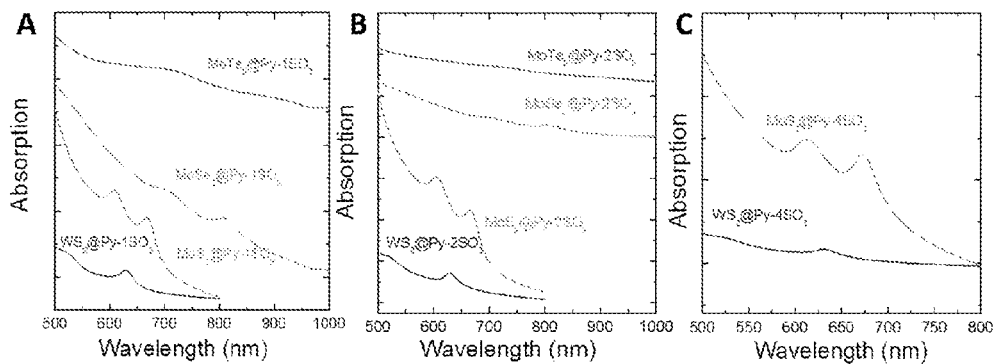
FIG. 12: (A) The optical absorption spectra of WS$_2$ (blue line), MoS$_2$ (green line), MoSe$_2$ (brown line), and MoTe$_2$ (pink line) dispersions prepared using Py-1SO$_3$; (B) The optical absorption spectra of WS$_2$ (blue line), MoS$_2$ (green line), MoSe$_2$ (brown line), and MoTe$_2$ (pink line) dispersions prepared using Py-2SO$_3$; (C) The optical absorption spectra of WS$_2$ (blue line), and MoS$_2$ (green line) dispersions prepared using Py-4SO$_3$. Note that the optical absorption of MoSe$_2$ and MoTe$_2$ dispersions were not collected because Py-4SO$_3$ does not exfoliate these crystals (FIG. 1).

FIG. 12 shows the absorption spectra of $WS_2$ (blue line), $MoS_2$ (green line), $MoSe_2$ (brown line), and $MoTe_2$ (pink line) dispersions obtained by using three pyrene derivatives. The concentrations of $WS_2$ and $MoS_2$ dispersions were calculated using for $WS_2$, $\alpha_{629}$=2756 ml/mg/m; and for $MoS_2$, $\alpha_{672}$=3400 ml/mg/m (where a is the extinction coefficient). In order to get the concentrations of $MoSe_2$@pyrene dispersions and $MoTe_2$@pyrene dispersions, we prepared four films by filtering 4.5 mL of $MoSe_2$@Py-1$SO_3$ dispersion, $MoSe_2$@Py-2$SO_3$ dispersion, and $MoTe_2$@Py-1$SO_3$ dispersion, and $MoTe_2$@Py-2$SO_3$ dispersion on the membranes, respectively. The four films were washed by 100 mL of water to remove the molecules residual. We got the mass of pristine membranes and checked one more time the mass of the membranes with our products which were dried completely. The difference in mass before and after filtering our products is the mass of the our products and then we can calculate the concentrations of $MoSe_2$@Pyrene dispersions and $MoTe_2$@Pyrene dispersions.

3.4.2 Raman Spectroscopy

The as-prepared 2D crystals were washed by DI water with the aid of centrifugation to remove the free pyrene molecules and then the flakes were drop-casted on the cleaned $SiO_2$/Si substrates for Raman measurements. The typical Raman spectra are shown in FIG. 13. The Raman spectrum of BNNS shows its main Raman active mode ($E_{2g}$) at ~1370 $cm^{-1}$. In the case of our exfoliated transition metal dichalcogenides, all of them share two main common features, the $E^1_{2g}$ mode and $A_{1g}$ mode, in their Raman spectrum because of their similar structure. Raman spectroscopy shows that the nanosheets have the same structure of the bulk crystals, indicating that the exfoliation process do not degrade the quality of the material 3.4.3 XPS of BNNS Film and $MoS_2$ Film BN: the film drying was performed at 80 degrees for 2 hours in the air before XPS measurement. Survey XPS spectrum of the BNNSs film is presented in FIG. 14A, which reveals the presence of boron, nitrogen, carbon, oxygen and sulfur with respective concentration of 47.2, 43.4, 6.4, 2.9, 0.1 at %, respectively. The presence of oxygen and carbon is usual for this kind of compound and was also observed on the starting compound (BN bulk powder, see FIG. 15A). Using the percentage of sulfur, we can estimate that the carbon content coming from the pyrene molecule is ~1.6%.

Figure 14:
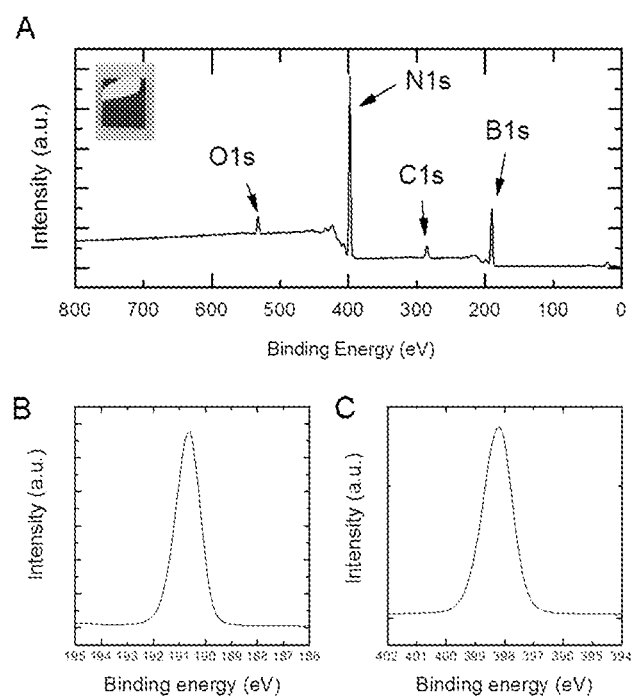
FIG. 14: (A) Survey XPS spectrum of BNNS film (inset: BNNSs film transferred on 290 nm-SiO$_2$/Si), (B) High-resolution B1s XPS scan of BNNS film, and (C) High-resolution N1s XPS scan of BNNS film.
Figure 15:
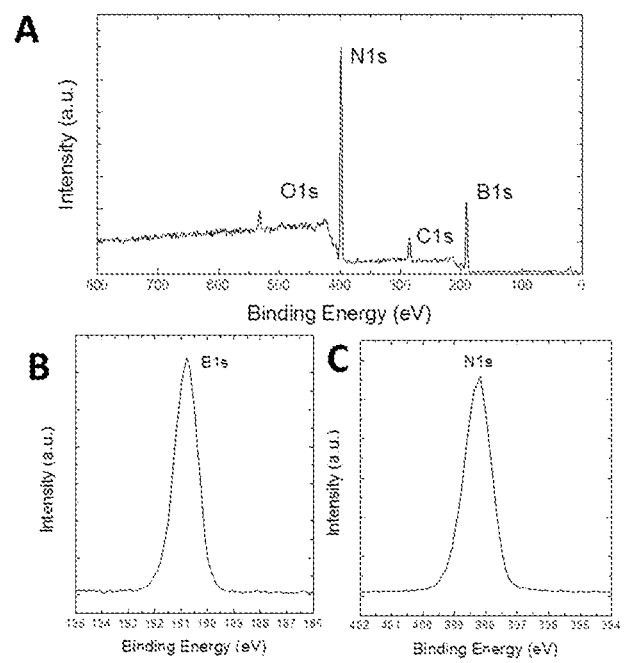
FIG. 15: (A) Survey XPS spectrum of the starting BN powder, (B) High-resolution B1s XPS scan of the BN powder, and (C) High-resolution N1s XPS scan of the BN powder.

FIG. 14B-C shows B1s and N1s high-resolution scans of BNNS film, peaking at 190.6 eV and 398.2 eV respectively. Very similar XPS spectra are observed for BNNS film (FIG. 14) and BN powder (FIG. 15). Both the B1s and N 1s spectra of BNNS film indicate that the configuration for B and N atoms is the B—N bond, implying that hexagonal crystalline structure exists in our BNNS.

Figure 16:
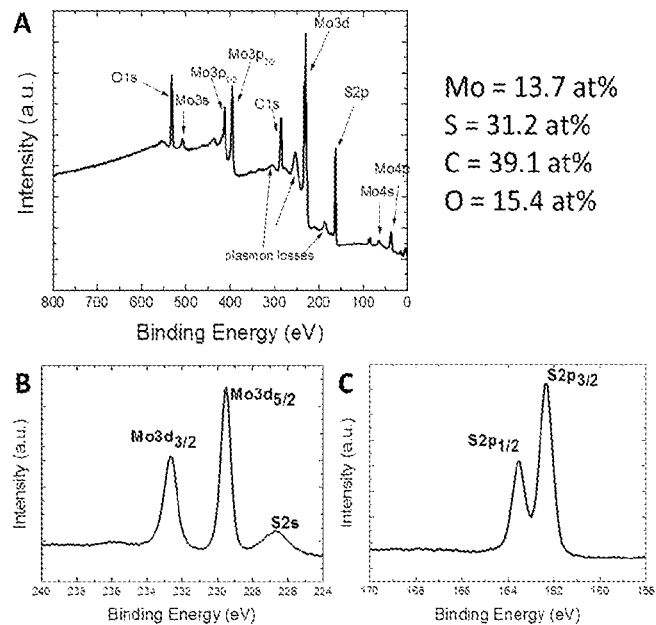
FIG. 16: (A) Survey XPS spectrum of MoS$_2$ film, (B) High-resolution Mo3d XPS scan of MoS$_2$ film, and (C) High-resolution S2p XPS scan of MoS$_2$ film.
Figure 17:
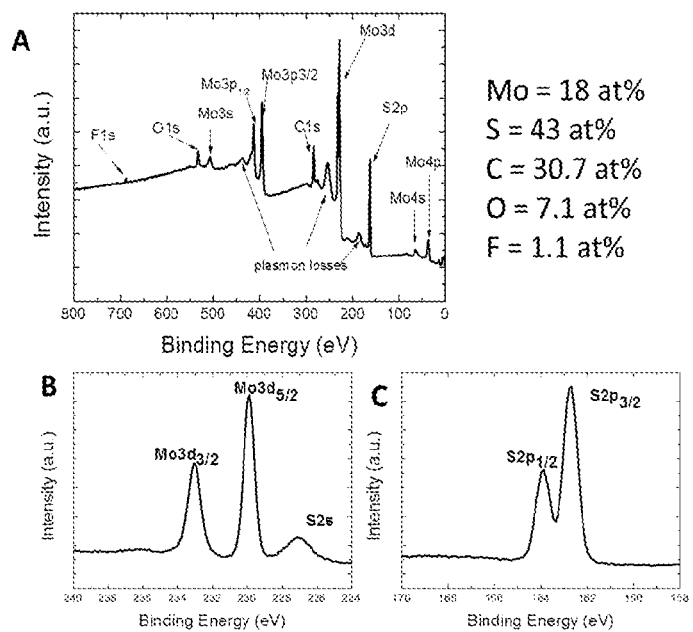
FIG. 17: (A) Survey XPS spectrum of MoS$_2$ powder, (B) High-resolution Mo3d XPS scan of MoS$_2$ powder, and (C) High-resolution S2p XPS scan of MoS$_2$ powder.

The survey XPS spectrum of the $MoS_2$@Pyrene film is presented in FIG. 16A. It reveals the presence of Mo, S, C, and O. The presence of oxygen and carbon, is usual for this kind of compound and was also observed on the starting compound ($MoS_2$ bulk powder, see FIG. 17). Compared to XPS of $MoS_2$ powder, the higher ratios of C and O in $MoS_2$@Pyrene film could be due to the presence of pyrene molecules in our dispersion. As shown in FIG. 16B-C, Mo3d spectra consist of peaks at around 229.5 and 232.6 eV which correspond to $Mo^{4+}3d_{5/2}$ and $Mo^{4+}3d_{3/2}$ components of 2H—$MoS_2$, respectively, indicating that the method did not induce any structural change (like 1T phase), as observed for example by ion-intercalation.

In the S2p region of the spectra (FIG. 16C), the known doublet peaks of 2H—$MoS_2$, $S2p_{1/2}$ and $S2p_{3/2}$ appear at 163.5 and 162.3 eV, respectively. Moreover, no peaks are observed between 168 and 170 eV, which indicates that sulphur atoms remain unoxidized during sonication.

Figure 18:
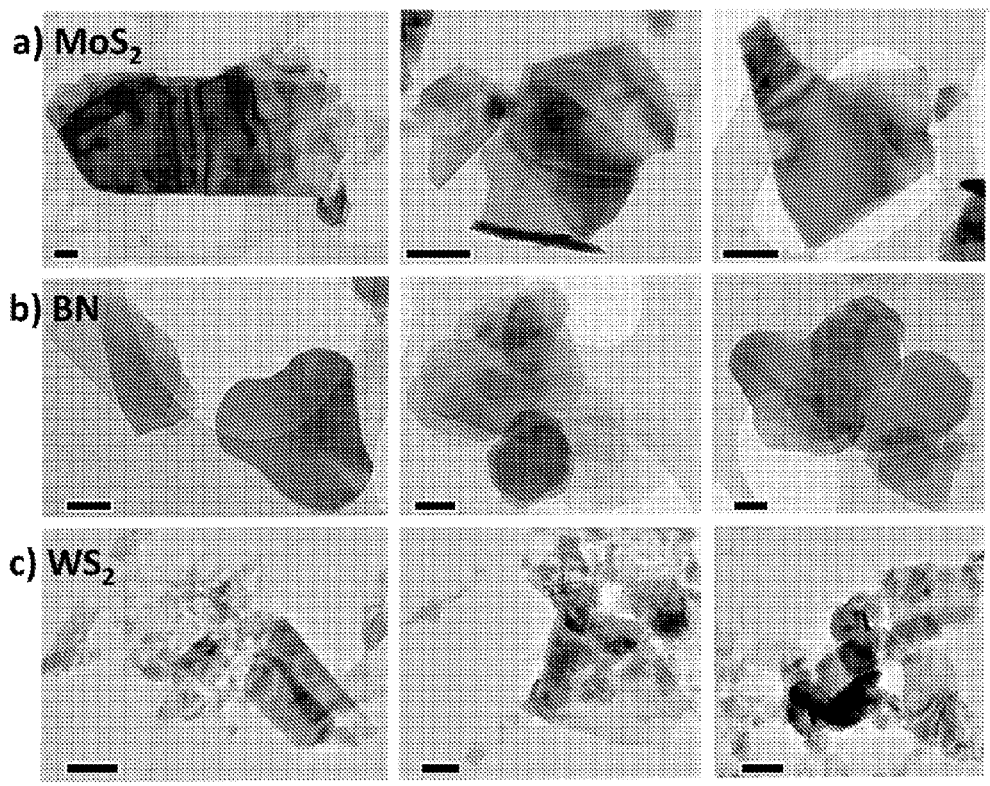
FIG. 18: Additional low magnification bright field TEM images illustrating the typical size, shape and thickness of flakes. Row (a) shows exfoliated MoS$_2$ nanosheets, row (b) shows exfoliated BN nanosheets, and row (c) shows exfoliated WS$_2$ nanosheets. All scale bars are 200 nm.
Figure 19:
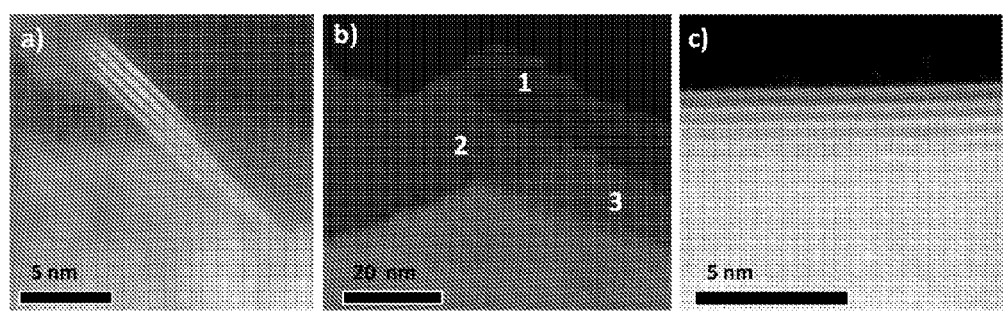
FIG. 19: Figure illustrating methods by which flake thickness was determined using high resolution HAADF STEM images. Where the flakes basal plane is oriented parallel to the imaging electron beam the flakes are viewed side-on and the number of layers is revealed directly from the number of parallel bright lines visible in the HAADF image as illustrated in a) for a WS$_2$ flake with a maximum thickness of 4 layers. Flake thickness can also be estimated from plan view image of flakes by studying the step change in contrast, b) shows the edge of a WS$_2$ flake where 1-, 2-, and 3-layer regions are clearly distinguished. Folded regions at the edge of plan view flakes can also be used to reveal flake thickness, c) shows the contrast at the folded edge of a 5-layer thick WS$_2$ flake.

FIG. 18 shows additional low-resolution TEM of the $MoS_2$, BN, and $WS_2$ nano-flakes. Some of them are nearly transparent to the electron beam, indicating that they are mono- or few-layers. We could investigate these objects in more details using high resolution HAADF STEM for those flake whose basal plane is oriented parallel to the imaging electron beam, as illustrated in FIG. 19. These images show that the suspensions are made of thin layers with thickness typically below 6 layers.

3.5 Fabrication of a Device

Figure 20:
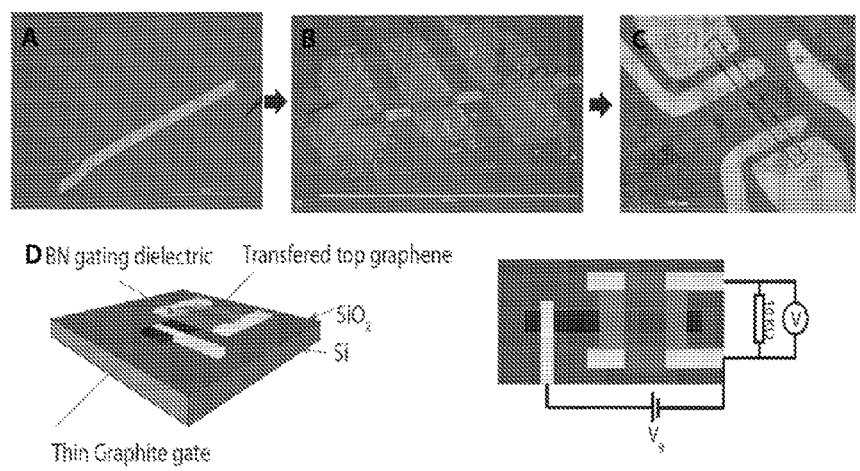
FIG. 20: (A) One thin graphite was transferred on SiO$_2$/Si as back gating electrode; (B) the BN thin films were transferred on thin graphite; (C) the contacts were put on BN film and thin graphite and then one graphene flake (the position is marked by black rectangle) was transferred on the top; (D) schematic of the device along with the measurement setup.

The fabrication process of a device is shown in FIG. 20 (A-C): first a thin/flat piece of graphite is mechanically exfoliated onto a $SiO_2$/Si wafer after this the BN thin film produced by vacuum filtering the BNNS@Py-1$SO_3$ dispersion is then transferred onto the thin graphite from another substrate via wet transfer process. Contacts are then patterned to the thin graphite and contacts are placed on the BN dispersion. Finally a graphene flake is transferred onto the already pre-patterned contacts using dry transfer technology. FIG. 20 (D) shows the basic schematic of the device.

3.6 Optimised Preparation of 2D Crystals-Based Inks hBN Dispersions in Water

The h-BN dispersions were produced by using liquid phase exfoliation in water with the help of 1-pyrenesulfonic acid sodium salt (Py-1$SO_3$, >97.0% (HPLC), purchased from Sigma-Aldrich). We sonicated 30 mg h-BN powder (~1 μm, 99%, purchased from Sigma-Aldrich) for 48 hrs in 10 mL of aqueous Py-1$SO_3$ solution with the concentration of $3.3\times10^{-4}$ mol/L. After the centrifugation at 3500 rpm for 10 mins, the yellowish h-BN nanosheet dispersion was collected in a bottle. The colour of the as-prepared h-BN dispersions is due to the Py-1$SO_3$ molecules since the pure h-BN dispersion is milky white. The concentration of the as-prepared h-BN dispersion is calculated based on the optical absorption h-BN dispersion at 550 nm, and it is ~0.104 mg/mL.

In a further method, the following chemicals were added to a glass pot which was stoppered and placed into a 600 W bath sonicator for 48 hours: $H_2O$—8 g; ethylene glycol—2.0 g; Triton-x100—0.6 mg; h-BN (flakes ~1 μm)—30 mg; 1-pyrenesulfonic acid sodium salt—1 mg. The solution was centrifuged at 1000 rpm for 20 minutes and the top ⅔ collected. The collected solution was then centrifuged at 3500 rpm for 20 mins and the top ⅔ collected. The collected material was placed into a 600 W bath sonicator for 48 hours. UV/Vis was then conducted from 800-200 nm using a Cary 5000 UV-Vis-Near IR spectrometer with the absorption coefficient $\alpha_{550}$=1000 L $g^{-1}$ $m^{-1}$ to determine h-BN concentration. The single- or few-layered h-BN concentration obtained was 0.3 mg/mL.

TMDC Dispersions in Water

Aqueous suspensions of $MoS_2$, $WS_2$, $MoTe_2$ and $MoSe_2$ have been prepared analogously to the first of the two processes described above for the preparation of aqueous h-BN suspensions and the concentrations of the resultant suspensions are shown in Table 2 above.

In a further method, the following chemicals were added to a glass pot which was stoppered and placed into a 600 W bath sonicator for 72 hours: $H_2O$—47.5 g; ethylene glycol—2.0 g; Triton-x100—3 mg; $MoS_2$ (flakes ~2 μm)—150 mg; 1-pyrenesulfonic acid sodium salt—6 mg. The solution was centrifuged at 1000 rpm for 20 minutes and the top ⅔ collected. The collected solution was then centrifuged at 3500 rpm for 20 mins and the top ⅔ collected. The collected material was placed into a 600 W bath sonicator for 48 hours. UV/Vis was then conducted from 800-200 nm using a Cary 5000 UV-Vis-Near IR spectrometer with the absorption coefficient $\alpha_{672}$=3400 L $g^{-1}$ $m^{-1}$ to determine $MoS_2$ concentration. The single- or few-layered $MoS_2$ concentration obtained in the suspension was 0.292 mg/mL.

The invention claimed is:

1. A method of producing an aqueous suspension of particles of a two-dimensional inorganic compound, the method comprising:
   a) providing multilayered particles of the inorganic compound in an aqueous medium which comprises at least one polycyclic aromatic compound, or a salt thereof; wherein the polycyclic aromatic compound is present in the aqueous medium in an amount from $1 \times 10^{-4}$ mol/L to $200 \times 10^{-4}$ mol/L, wherein the or each polycyclic aromatic compound independently has a ring system which comprises from 2 to 10 fused benzene rings, the ring system being substituted with from 1 to 4 independently selected hydrophilic groups, each hydrophilic group consisting of less than 20 atoms;
   b) subjecting the multilayered particles of the inorganic compound in the aqueous medium to energy to obtain a suspension;
   c) when the suspension obtained in step b) also comprises multilayered particles of the inorganic compound, the method further comprises the step of reducing the amount of multilayered particles of the inorganic compound in the suspension to obtain an aqueous suspension comprising particles of the two-dimensional inorganic compound and the at least one polycyclic aromatic compound.

2. A method of claim 1, wherein the ring system of the polycyclic aromatic compound contains 3 to 6 fused benzene rings and at least one ring contains two atoms in common with each of two or more other rings.

3. A method of claim 1, wherein the independently selected hydrophilic groups of the polycyclic aromatic compound may consist of less than 6 atoms independently selected from S, O, P, H, C, N, B and I.

4. A method of claim 1, wherein at least one hydrophilic group is a sulfonic acid or a base addition salt of a sulfonic acid.

5. A method of claim 1, wherein the polycyclic aromatic compound is selected from:

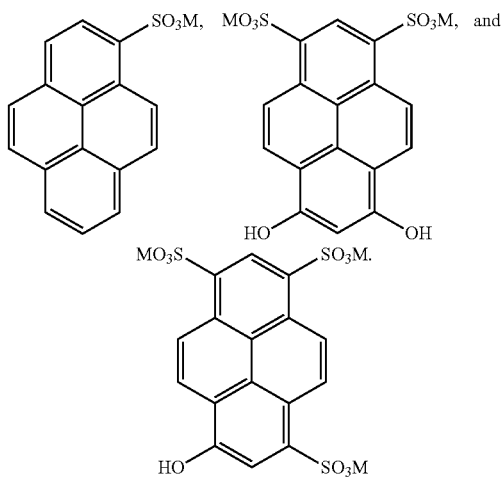

6. A method of claim 1, wherein the polycyclic aromatic compound is present in the aqueous medium in an amount from $1 \times 10^{-4}$ mol/L to $66 \times 10^{-4}$ mol/L.

7. A method of claim 1, wherein the aqueous medium comprises an alcohol and wherein the alcohol may form from 10 to 30% by volume of the aqueous media.

8. A method of claim 1, wherein the aqueous medium is deuterated water.

9. A method of claim 1, wherein the aqueous medium has a pH in the range from 1 to 7.

10. A method of claim 1, wherein greater than 75% by weight of the particles of the two dimensional inorganic compound have a diameter between 50 and 750 nm.

11. A method of claim 1, wherein the inorganic compound is h-BN.

12. A method of claim 11, wherein greater than 75% by weight of the two dimensional inorganic compound has a thickness of from 1 to 3 molecular layers.

13. A method of claim 1, wherein the inorganic compound is a transition metal dichalcogenide.

14. A method of claim 13, wherein greater than 75% by weight of the two dimensional inorganic compound has a thickness of from 4 to 6 molecular layers.

15. A method of claim 1, wherein the energy is sonic energy.

16. A suspension of particles of a two-dimensional inorganic compound in an aqueous medium comprising at least one polycyclic aromatic compound; wherein the or each polycyclic aromatic compound independently has a ring system which comprises from 2 to 6 fused benzene rings, the ring system being substituted with from 1 to 4 hydrophilic groups each independently consisting of less than 20 atoms.

17. A suspension of claim 16, wherein the suspension has been made by a method comprising:
  a) providing multilayered particles of the inorganic compound in an aqueous medium which comprises at least one polycyclic aromatic compound, or a salt thereof; wherein the polycyclic aromatic compound is present in the aqueous medium in an amount from $1 \times 10^{-4}$ mol/L to $200 \times 10^{x4}$ mol/L, wherein the or each polycyclic aromatic compound independently has a ring system which comprises from 2 to 10 fused benzene rings, the ring system being substituted with from 1 to 4 independently selected hydrophilic groups, each hydrophilic group consisting of less than 20 atoms;
  b) subjecting the multilayered particles of the inorganic compound in the aqueous medium to energy to obtain a suspension;
  c) when the suspension obtained in step b) also comprises multilayered particles of the inorganic compound, the method further comprises the step of reducing the amount of multilayered particles of the inorganic compound in the suspension to obtain an aqueous suspension comprising particles of the two-dimensional inorganic compound and the at least one polycyclic aromatic compound.

18. An electronic device, the device comprising at least one thin film layer which comprises a plurality of particles of a two-dimensional inorganic compound, wherein the or each thin film contains at least one polycyclic aromatic compound; wherein the or each polycyclic aromatic compound independently has a ring system which comprises from 2 to 6 fused benzene rings, the ring system being substituted with from 1 to 4 hydrophilic groups each independently consisting of less than 20 atoms.

19. A method of forming a thin film comprising a plurality of particles of a two-dimensional inorganic compound, the method comprising
  a) obtaining an aqueous suspension of particles of a two-dimensional inorganic compound using the method of claim 1; and
  b) depositing the suspension of particles of the two-dimensional inorganic compound in an aqueous medium onto a substrate to form the thin film comprising a plurality of particles of the two-dimensional inorganic compound.

* * * * *